(12) United States Patent
Wu et al.

(10) Patent No.: US 12,388,009 B2
(45) Date of Patent: Aug. 12, 2025

(54) SEMICONDUCTOR DEVICE INCLUDING STRUCTURE CONNECTING FRONTSIDE AND BACKSIDE METAL AND METHOD OF MANUFACTURING THE SAME

(71) Applicant: TAIWAN SEMICONDUCTOR MANUFACTURING COMPANY LTD., Hsinchu (TW)

(72) Inventors: Chia-Tien Wu, Taichung (TW); Wei-Cheng Lin, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 532 days.

(21) Appl. No.: 17/836,875

(22) Filed: Jun. 9, 2022

(65) Prior Publication Data
US 2023/0402367 A1    Dec. 14, 2023

(51) Int. Cl.
*H01L 23/522*    (2006.01)
*H01L 21/768*    (2006.01)
(Continued)

(52) U.S. Cl.
CPC .... *H01L 23/5226* (2013.01); *H01L 23/49805* (2013.01); *H01L 23/53209* (2013.01);
(Continued)

(58) Field of Classification Search
CPC ............. H01L 21/486; H01L 21/76898; H01L 21/76807; H01L 2225/06548; H01L 2225/06541; H01L 2225/06544; H01L 23/49827; H01L 23/49822; H01L 23/49833; H01L 23/5226; H01L 23/5286; H01L 23/49805; H01L 23/53223; H01L 23/53238; H01L 23/53252; H01L 23/53233; H01L 23/53219; H01L 23/53247; H01L 23/53257; H01L 25/0655; H01L 25/042; H01L 25/072;
(Continued)

(56) References Cited

U.S. PATENT DOCUMENTS

| | | | |
|---|---|---|---|
| 2007/0111342 A1* | 5/2007 | Satya | H01L 23/5226 257/E23.145 |
| 2022/0037236 A1* | 2/2022 | Seo | H01L 25/0652 |
| 2022/0262723 A1* | 8/2022 | Bao | H01L 21/76885 |

* cited by examiner

*Primary Examiner* — Dale E Page
*Assistant Examiner* — Douglas Yap
(74) *Attorney, Agent, or Firm* — WPAT LAW; Anthony King

(57) ABSTRACT

The present disclosure provides a semiconductor device and a method of manufacturing a semiconductor device. The semiconductor device comprises a substrate, an isolation layer, a first electronic device, a first interconnection structure, a first conductive structure, and a second conductive structure. The substrate has a first surface and a second surface opposite the first surface. The isolation layer contacts the second surface of the substrate and has a first surface facing away from the substrate. The first electronic device is embedded in the substrate. The first interconnection structure extends from the first surface of the substrate to the first surface of the isolation layer. The first conductive structure is disposed on the first surface of the substrate. The second conductive structure contacts the first surface of the isolation layer. The first conductive structure and the second conductive structure are electrically connected by the first interconnection structure.

20 Claims, 17 Drawing Sheets

(51) Int. Cl.
*H01L 23/498* (2006.01)
*H01L 23/532* (2006.01)
*H01L 25/065* (2023.01)

(52) U.S. Cl.
CPC .. *H01L 21/76801* (2013.01); *H01L 21/76805* (2013.01); *H01L 23/53219* (2013.01); *H01L 23/53223* (2013.01); *H01L 23/53233* (2013.01); *H01L 23/53238* (2013.01); *H01L 23/53247* (2013.01); *H01L 23/53252* (2013.01); *H01L 23/53257* (2013.01); *H01L 23/53266* (2013.01); *H01L 25/0655* (2013.01); *H01L 2221/1015* (2013.01); *H01L 2225/0651* (2013.01); *H01L 2225/06517* (2013.01); *H01L 2225/06541* (2013.01)

(58) Field of Classification Search
CPC ............ H01L 25/0753; H01L 25/0651; H01L 25/0652; H01L 25/06517; H01L 2224/05006; H01L 2224/05546
See application file for complete search history.

SEMICONDUCTOR DEVICE INCLUDING STRUCTURE CONNECTING FRONTSIDE AND BACKSIDE METAL AND METHOD OF MANUFACTURING THE SAME

BACKGROUND

The present invention relates generally to semiconductor devices, and more particularly to semiconductor devices connecting frontside and backside metals for signal routing and power delivery network and methods of manufacturing the same.

Scaled technologies put considerable strain on back end of line (BEOL) design, leading to multiple challenges like pin access and routing congestion. In addition, with dimension scaling, IC performance becomes limited by BEOL resistivity. Conventionally only frontside (F/S) BEOL is used for signal and power delivery network (PDN) routing on the chip. The tight pitch required for the lower metal layers of the F/S BEOL leads to high resistivity and capacitance in the metal routing due to shallow metal and the proximity of such metal layers.

Innovative technologies are therefore needed to tackle these bottlenecks to assist further device and IC scaling. Backside (B/S) metal layers are separately manufactured under the substrate, which allows B/S metal customization in terms of metal pitch, thickness, and critical dimension independent of design rules in the F/S BEOL, which enables flexible optimization of metal RC. However, a key challenge is connection of F/S and B/S metal with a low-resistance path.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
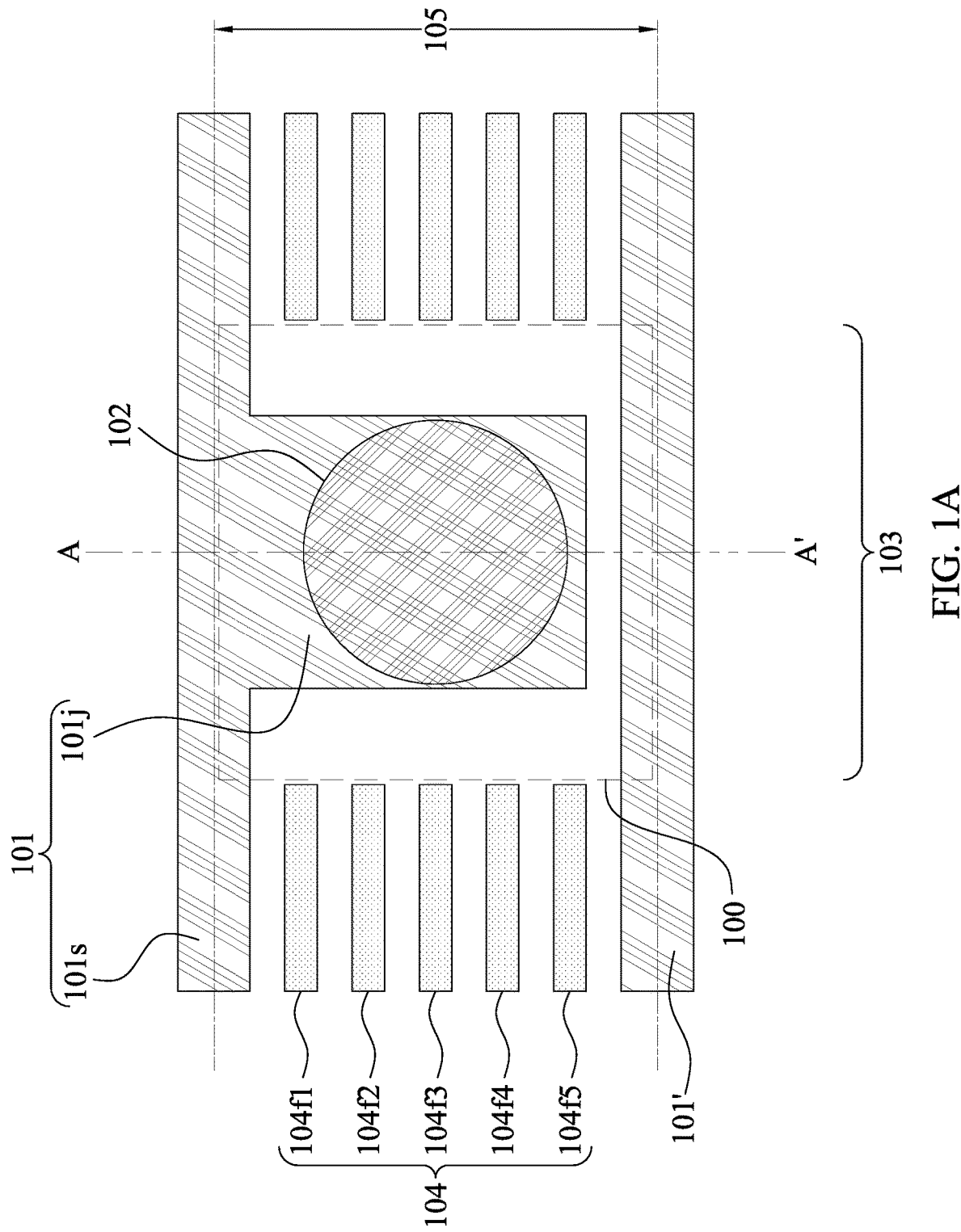
FIG. 1A illustrates an exemplary top view of a semiconductor structure, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1A illustrates an exemplary top view of a semiconductor structure, in accordance with some embodiments of the present disclosure. From a top view perspective of a semiconductor structure, a tape cell 100 is a region wherein a feedthrough via is formed. Conductive structures 101 and 101' are used for transmitting power signals for the semiconductor structure. The conductive structure 101 comprises a portion 101s and another portion 101j integrally formed. The portion 101s can be referred to as a straight portion, while the portion 101j can be referred to as a jog portion. An interconnection structure 102 may be a feedthrough via (FTV). The conductive structure 101 is electrically connected to the interconnection structure 102 through the portion 101j. In some embodiments, the interconnection structure 102 is disposed between the conductive structures 101 and 101'. In some embodiments, the portion 101j can cover the interconnection structure 102 from the top view perspective. In other embodiments, the portion 101j may expose at least a portion of the interconnection structure 102 from the top view perspective.

As shown in FIG. 1A, the tap cell 100 includes a part of the portion 101s, the portion 101j, a part of the conductive structure 101' and the interconnection structure 102. The tap cell has a pitch 103. The pitch 103 is in a range of 0.03 to 300 um. In the present disclosure, a tap cell can be a zone in which no active semiconductor device is disposed. The interconnection structure 102 arranged in the tap cell 100 can thus be kept a sufficient distance from neighboring active semiconductor devices.

A conductive structure 104 comprises fingers 104/1-104/5. The fingers 104/1-104/5 can collaboratively form a fence pattern. The fingers 104/1-104/5 are parallel to the conductive structures 101 and 101'. The conductive structure 104 is disposed between the conductive structures 101 and 101'. The conductive structure 104 can be configured for transmitting signals. Each of the fingers 104/1-104/5 can be referred to as a signal track. The tap cell 100 has a cell height 105. The cell height 105 is in a range of 40 to 300 nm.

Figure 1B:
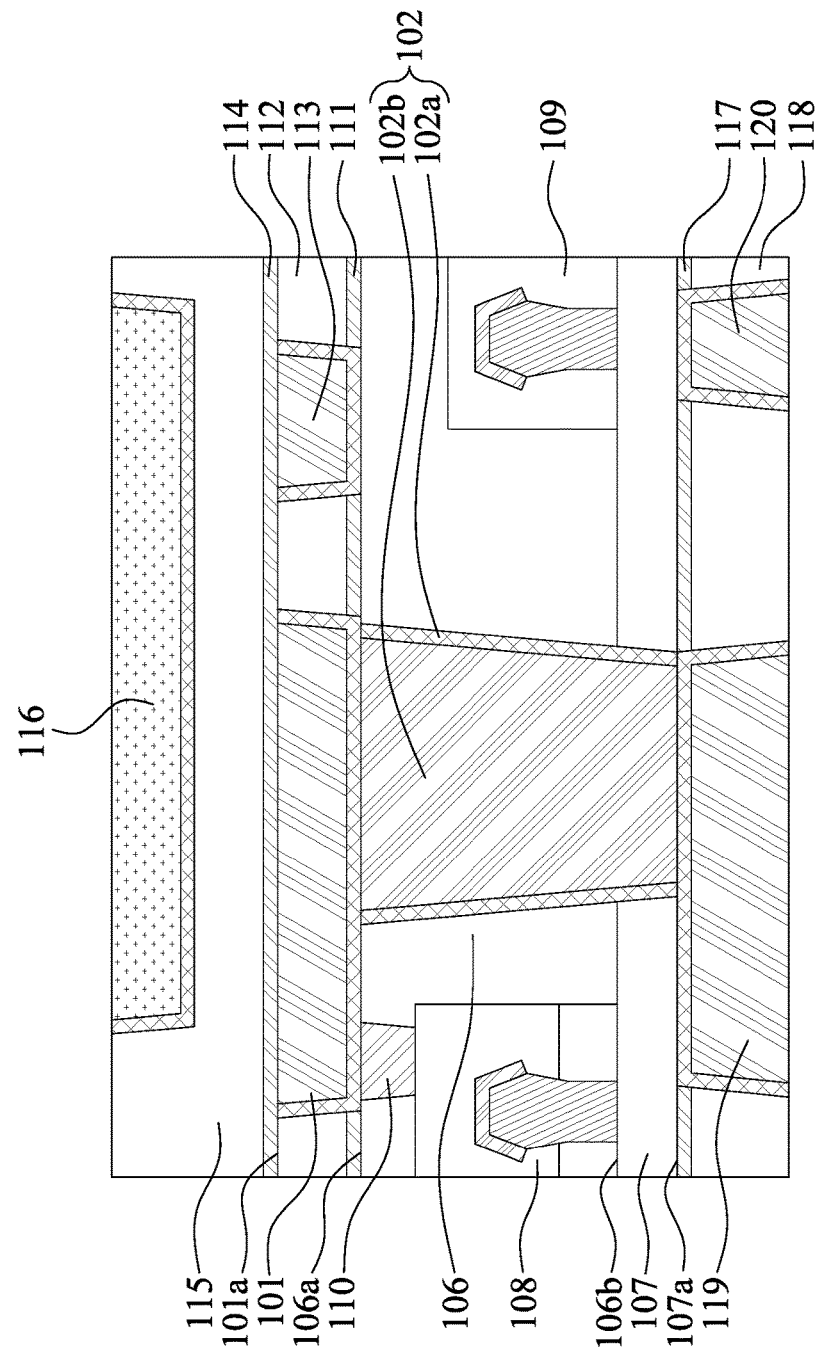
FIG. 1B illustrates an exemplary cross-section of a semiconductor structure, in accordance with some embodiments of the present disclosure.

FIG. 1B illustrates an exemplary cross-section of a semiconductor structure 10, in accordance with some embodiments of the present disclosure. The cross-section shown in FIG. 1B can correspond to the cross-section obtained along the dashed line A-A' of FIG. 1A. A substrate 106 is provided. The substrate 106 has a surface 106a and a surface 106b opposite the surface 106a. An isolation layer 107 is formed under the surface 106b. The isolation layer 107 contacts the surface 106b of the substrate 106. The isolation layer 107 has a surface 107a facing away from the substrate 106. The semiconductor structure 10 includes electronic devices 108 and 109 embedded in the substrate 106. The electronic devices 108 and 109 may be of different conductive types. An interconnection structure 102 extends from the surface 106a of the substrate 106 to the surface 107a of the isolation layer 107. The interconnection structure 102 penetrates the substrate 106 and the isolation layer 107. One terminal of the interconnection structure 102 can be exposed by the surface 106a of the substrate 106, and the other terminal of the interconnection structure 102 can be exposed by the surface 107a of the isolation layer 107.

An isolation layer 111 is disposed on the surface 106a of the substrate 106. An isolation layer 112 is disposed on the isolation layer 111. A conductive structure 101 is disposed on the surface 106a of the substrate 106. The conductive structure 101 is sandwiched between the isolation layers 111 and 114. The conductive structure 101 is embedded in the isolation layer 112. The conductive structure 101 has a surface 101a facing away from the substrate 106. A conductive structure 113 is disposed on the surface 106a of the substrate 106. The conductive structure 113 is sandwiched between the isolation layers 111 and 114. The conductive structure 113 is embedded in the isolation layer 112. An isolation layer 114 is disposed on the surface 101a of the conductive structure 101. The isolation layer 114 is disposed on the isolation layer 112. An isolation layer 115 is disposed on the isolation layer 114. A conductive structure 116 is embedded in the material 115. An interconnection structure 110 electrically connects the conductive structure 101 and the electronic device 108.

An isolation layer 117 is disposed under the surface 107a of the isolation layer 107. An isolation layer 118 is disposed under the isolation layer 117. A conductive structure 119 is disposed under the surface 107a of the isolation layer 107. The conductive structure 119 is embedded in the isolation layer 118. The conductive structure 119 contacts the surface 107a of the isolation layer 107. A conductive structure 120 is disposed under the surface 107a of the isolation layer 107. The conductive structure 120 is embedded in the isolation layer 118. The conductive structure 120 contacts the surface 107a of the isolation layer 107. The conductive structure 101 and the conductive structure 119 are electrically connected by the interconnection structure 102.

As shown in FIG. 1B, the electronic device 108 and the electronic device 109 are disposed on different sides of the interconnection structure 102. The conductive structure 101 and the conductive structure 119 are configured to receive a first reference voltage (e.g., VDD). The electronic device 108 can receive the first reference voltage through, for example, the conductive structure 119, the interconnection structure 102, the conductive structure 101, and the interconnection structure 110. Referring to FIG. 1B, the PDN for delivering power to the electronic device 108 involves conductive structures on both sides of the substrate 106 (i.e., the conductive structures 101 and 119).

The conductive structure 113 and the conductive structure 120 are configured to receive a second reference voltage (e.g., VSS). The conductive structure 113 is spaced apart from the conductive structure 101. The conductive structure 120 is spaced apart from the conductive structure 119. The conductive structure 116 is separated from the conductive structure 101 and the conductive structure 113.

The interconnection structure 102 comprises a body 102b and a barrier layer 102a. The barrier layer 102a is disposed on sidewalls, a top surface, and a bottom surface of the body 102b. The barrier layer 102a comprises one or more of Ta, TaN, Co, Ru, Al, Ti, TiN, Mn, Nb or air. The body 102b comprises one or more of Cu, Ru, W, Ti, Al, Co, Mo, Ir, Rh.

Figure 2A:
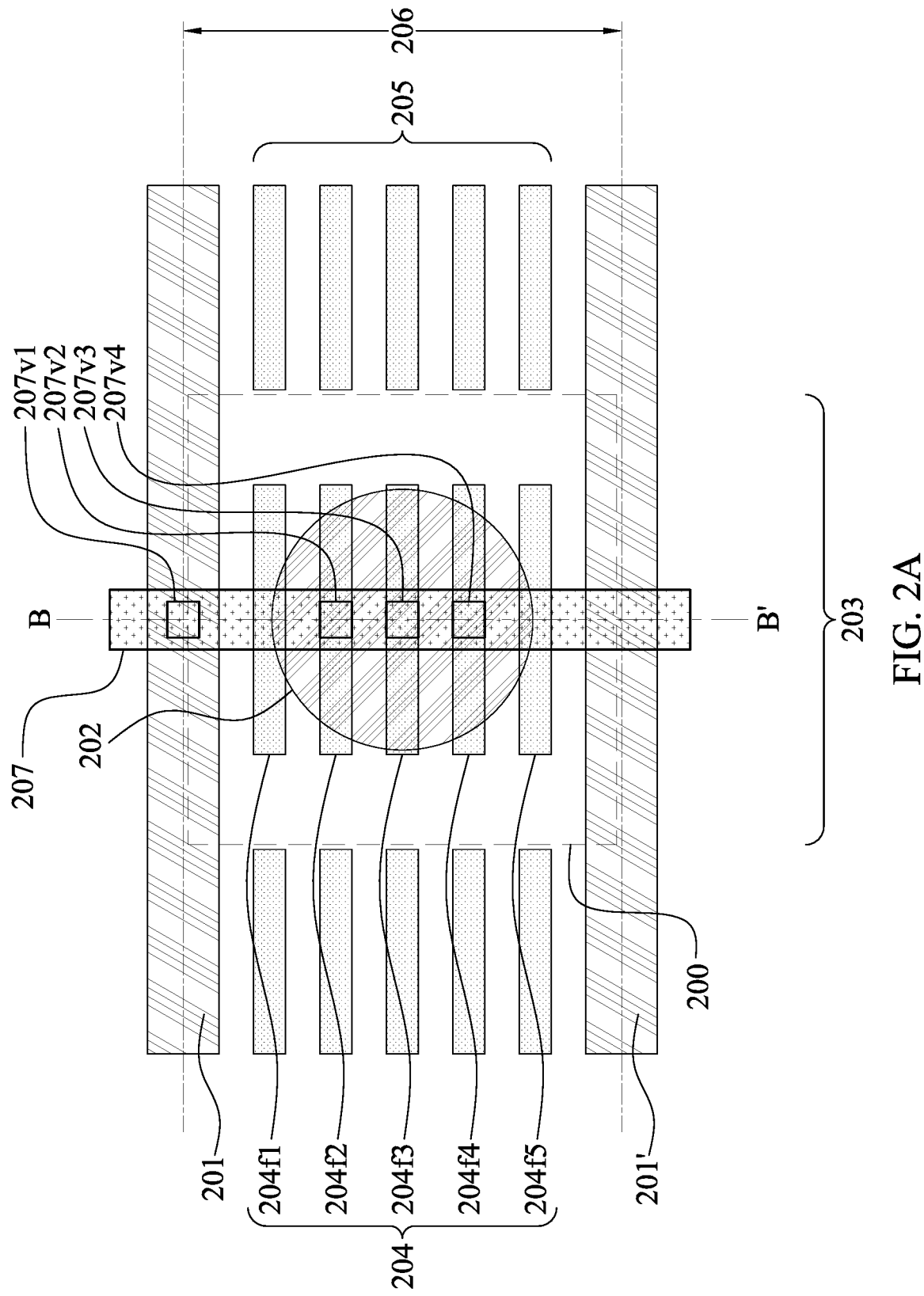
FIG. 2A illustrates an exemplary top view of a semiconductor structure, in accordance with some embodiments of the present disclosure.

FIG. 2A illustrates an exemplary top view of a semiconductor structure, in accordance with some embodiments of the present disclosure. From a top view perspective of a semiconductor structure, a tape cell 200 is a region wherein a feedthrough via is formed. Conductive structures 201 and 201' are used for transmitting power signals for the semiconductor structure. An interconnection structure 202, which may be a FTV, is disposed within the tap cell 200. In some embodiments, the interconnection structure 202 is disposed between the conductive structures 201 and 201'. The interconnection structure 202 can be sandwiched between the conductive structures 201 and 201' from the top view perspective.

As shown in FIG. 2A, the tap cell has a pitch 203. The pitch 203 is in a range of 0.03 to 3000 um. A conductive structure 204 comprises fingers 204/1-204/5. The fingers 204/1-204/5 can collaboratively form a fence pattern. The conductive structure 204 is disposed between the conductive structures 201 and 201'. The fingers 204/1-204/5 partially covers the interconnection structure 202 from the top view perspective. The fingers 204/1-204/5 expose at least a portion of the interconnection structure 202 from the top view perspective. The fingers 204/1-204/5 are parallel to the conductive structures 201 and 201'. The conductive structure 205 is disposed between the conductive structures 201 and 201'. The conductive structure 205 comprises a fence pattern. The conductive structures 204 and 205 are used for transmitting signals. Each of the fingers of the conductive structures 204 and 205 can be referred to as a signal track. The tap cell 200 has a cell height 206. The cell height 206 is in a range of 40 to 300 nm.

From the top view perspective, a conductive structure 207 partially covers the conductive structures 201 and 201', the interconnection structure 202, and the conductive structure 204. The conductive structure 207 is orthogonal to the conductive structures 201 and 201' and the conductive structure 204. The conductive structure 207 has vias 207$v$1-207$v$4. The via 207$v$1 is disposed at the intersection of the conductive structure 207 and the conductive structure 201. The vias 207$v$2-207$v$4 are disposed at the intersection of the conductive structure 207 and the conductive structure 204. As shown in FIG. 2A, the tap cell 200 includes a part of the conductive structures 201, a part of the conductive structure 201', the interconnection structure 202, the conductive structure 204 and a portion of the conductive structure 207.

Figure 2B:
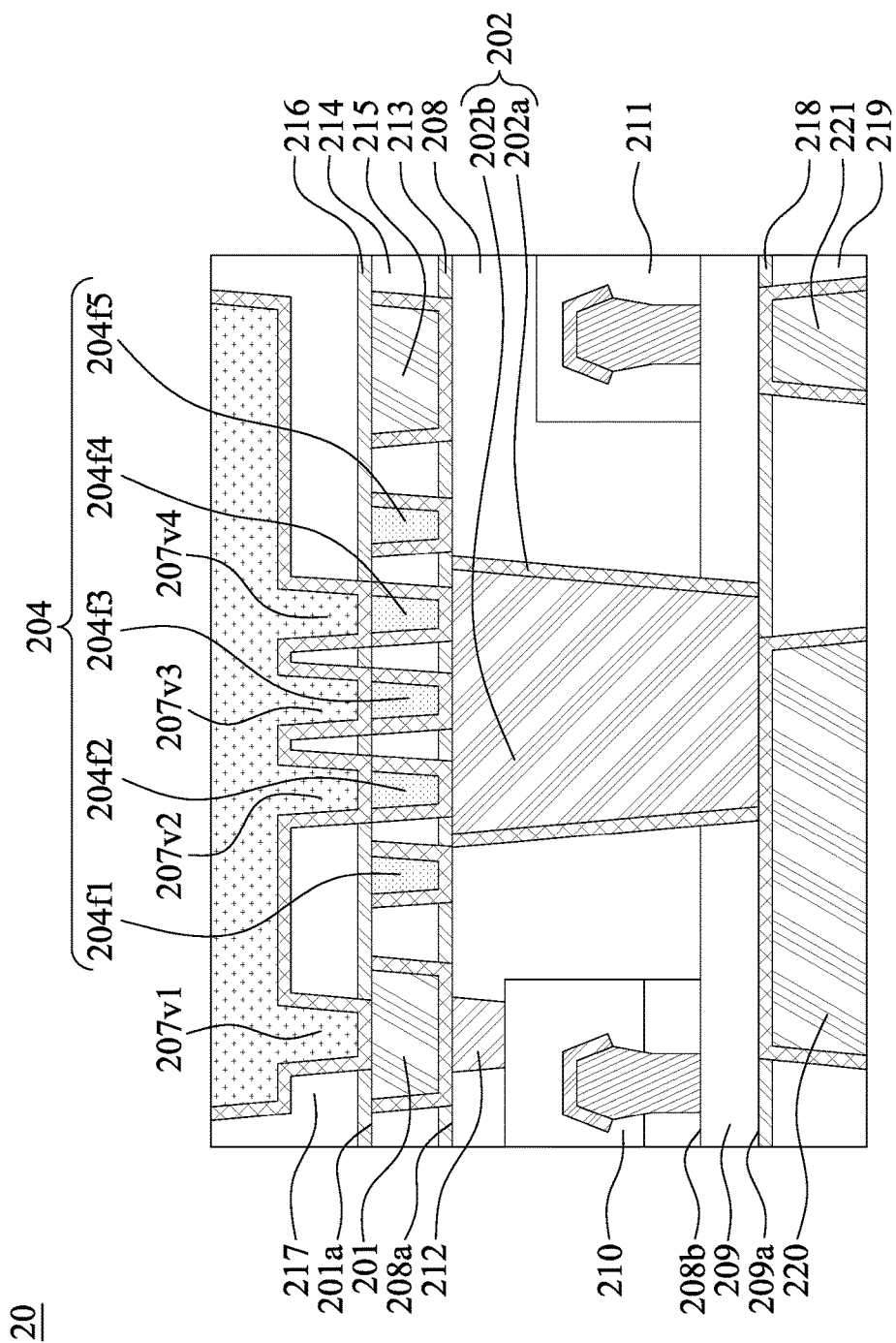
FIG. 2B illustrates an exemplary cross-section of a semiconductor structure, in accordance with some embodiments of the present disclosure.

FIG. 2B illustrates an exemplary cross-section of a semiconductor structure 20, in accordance with some embodiments of the present disclosure. The cross-section shown in FIG. 2B can correspond to the cross-section obtained along the dashed line B-B' of FIG. 2A. A substrate 208 is provided. The substrate 208 has a surface 208$a$ and a surface 208$b$ opposite the surface 208$a$. An isolation layer 209 is formed under the surface 208$b$. The isolation layer 209 contacts the surface 208$b$ of the substrate 208. The isolation layer 209 has a surface 209$a$ facing away from the substrate 208. The semiconductor structure 20 includes electronic devices 210 and 211 embedded in the substrate 208. The electronic devices 210 and 211 may be of different conductive types. An interconnection structure 202 extends from the surface 208$a$ of the substrate 208 to the surface 209$a$ of the isolation layer 209. The interconnection structure 202 penetrates the substrate 208 and the isolation layer 209. One terminal of the interconnection structure 202 can be exposed by the surface 208$a$ of the substrate 208, and the other terminal of the interconnection structure 202 can be exposed by the surface 209$a$ of the isolation layer 209.

An isolation layer 213 is disposed on the surface 208$a$ of the substrate 208. An isolation layer 214 is disposed on the isolation layer 213. A conductive structure 201 is disposed on the surface 208$a$ of the substrate 208. The conductive structure 201 is sandwiched between the isolation layers 213 and 215. The conductive structure 201 is embedded in the isolation layer 214. The conductive structure 201 has a surface 201$a$ facing away from the substrate 208. A conductive structure 215 is disposed on the surface 208$a$ of the substrate 208. The conductive structure 215 is sandwiched between the isolation layers 213 and 215. The conductive structure 215 is embedded in the isolation layer 214. A conductive structure 204 is disposed on the surface 208$a$ of the substrate 208. The conductive structure 204 comprises fingers 204/1-204/5. The fingers 204/1-204/5 can collaboratively form a fence pattern. The conductive structure 204 covers a first portion of the interconnection structure 202 and exposes a second portion of the interconnection structure 202.

An isolation layer 216 is disposed on the surface 201$a$ of the conductive structure 201. The isolation layer 216 is disposed on the isolation layer 214. An isolation layer 217 is disposed on the isolation layer 216. A conductive structure 207 is embedded in the isolation layer 217. The conductive structure 207 comprises vias 207$v$1-207$v$4. The vias 207$v$1-207$v$4 are disposed on the surface 201$a$ of the conductive structure 201. The via 207$v$1 contacts the conductive structure 201. The via 207$v$2 contacts the fence pattern 204/2 of the conductive structure 204. The via 207$v$3 contacts the fence pattern 204/3 of the conductive structure 204. The via 207$v$4 contacts the fence pattern 204/4 of the conductive structure 204. An interconnection structure 212 electrically connects the conductive structure 201 and the electronic device 210.

An isolation layer 218 is disposed under the surface 209$a$ of the isolation layer 209. An isolation layer 219 is disposed under the isolation layer 218. A conductive structure 220 is disposed under the surface 209$a$ of the isolation layer 209. The conductive structure 220 is embedded in the isolation layer 219. The conductive structure 220 contacts the surface 209$a$ of the isolation layer 209. A conductive structure 221 is disposed under the surface 209$a$ of the isolation layer 209. The conductive structure 221 is embedded in the isolation layer 219. The conductive structure 221 contacts the surface 209$a$ of the isolation layer 209. The conductive structure 207 and the conductive structure 220 are electrically connected by the interconnection structure 202 and the conductive structure 204.

As shown in FIG. 2B, the electronic device 210 and the electronic device 211 are disposed on different sides of the interconnection structure 202. The conductive structure 201 and the conductive structure 220 are configured to receive a first reference voltage (e.g., VDD). The electronic device 210 can receive the first reference voltage through, for example, the conductive structure 220, the interconnection structure 202, the conductive structure 204, the conductive structure 207, the conductive structure 201, and the interconnection structure 212. Referring to FIG. 2B, the PDN for delivering power to the electronic device 210 involves conductive structures on both sides of the substrate 208 (i.e., the conductive structures 201, 204, 207, and 220).

The conductive structure 215 and the conductive structure 221 are configured to receive a second reference voltage (e.g., VSS). The conductive structure 215 is spaced apart from the conductive structure 201. The conductive structure 221 is spaced apart from the conductive structure 220. The conductive structure 204 is spaced apart from the conductive structures 201 and 215.

The interconnection structure 202 comprises a body 202$b$ and a barrier layer 202$a$. The barrier layer 202$a$ is disposed on sidewalls and a bottom surface of the body 202$b$. The barrier layer 202$a$ comprises one or more of Ta, TaN, Co, Ru, Al, Ti, TiN, Mn, Nb or air. The body 202$b$ comprises one or more of Cu, Ru, W, Ti, Al, Co, Mo, Ir, Rh.

Figure 3A:
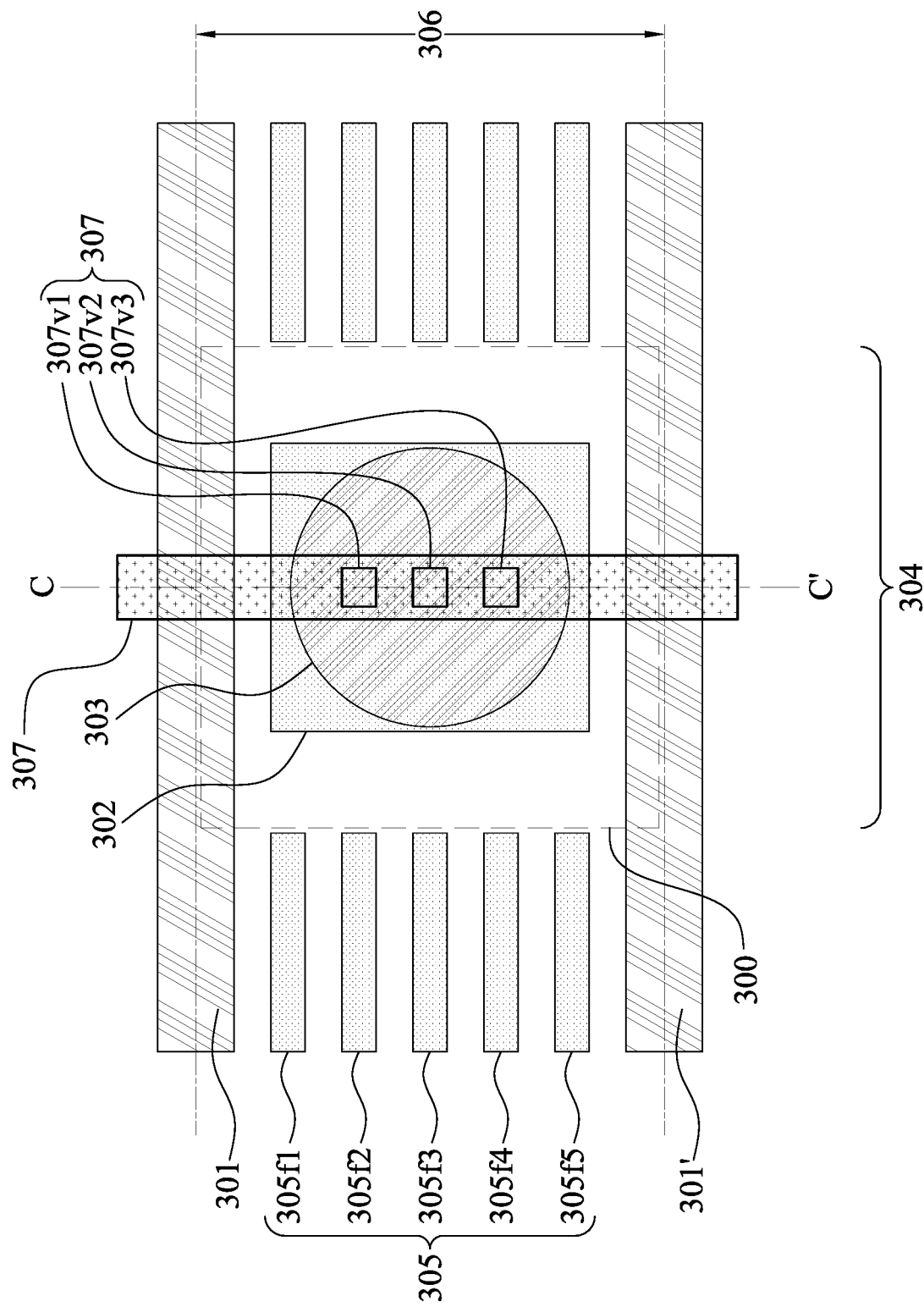
FIG. 3A illustrates an exemplary top view of a semiconductor structure, in accordance with some embodiments of the present disclosure.

FIG. 3A illustrates an exemplary top view of a semiconductor structure, in accordance with some embodiments of the present disclosure. From a top view perspective of a semiconductor structure, a tape cell 300 is a region wherein a feedthrough via is formed. Conductive structures 301 and 301' are used for transmitting power signals for the semiconductor structure. In some embodiments, a conductive structure 302 is disposed between the conductive structures 301 and 301'. The conductive structure 302 is spaced apart from the conductive structures 301 and 301' from the top view. In some embodiments, an interconnection structure 303, which may be a FTV, is disposed within the tap cell 300. In some embodiments, the interconnection structure 303 is disposed between the conductive structures 301 and 301'. The interconnection structure 303 can be sandwiched between the conductive structures 301 and 301' from the top view perspective.

As shown in FIG. 3A, the tap cell has a pitch 304. The pitch 304 is in a range of 0.03 to 3000 um. A conductive structure 305 comprises fingers 305f1-305f5. The fingers 305f1-305f5 can collaboratively form a fence pattern. The conductive structure 302 is disposed between the conductive structures 301 and 301'. The fingers 305f1-305f5 are parallel to the conductive structures 301 and 301'. The conductive structure 303 is disposed between the conductive structures 301 and 301'. The conductive structure 305 can be configured for transmitting signals. Each of the fingers 305f1-305f5 can be referred to as a signal track. The tap cell 300 has a cell height 306. The cell height 306 is in a range of 40 to 300 nm.

From the top view perspective, a conductive structure 307 partially covers the conductive structures 301 and 301', the conductive structure 302, and the interconnection structure 303. The conductive structure 307 is orthogonal to the conductive structures 301 and 301'. The conductive structure 307 has vias 307v1-307v3. The vias 307v1-307v3 are disposed at the intersection of the conductive structure 307 and the conductive structure 302. As shown in FIG. 2A, the tap cell 300 includes a part of the conductive structures 301, a part of the conductive structure 301', the conductive structure 302, the interconnection structure 303 and a portion of the conductive structure 307.

Figure 3B:
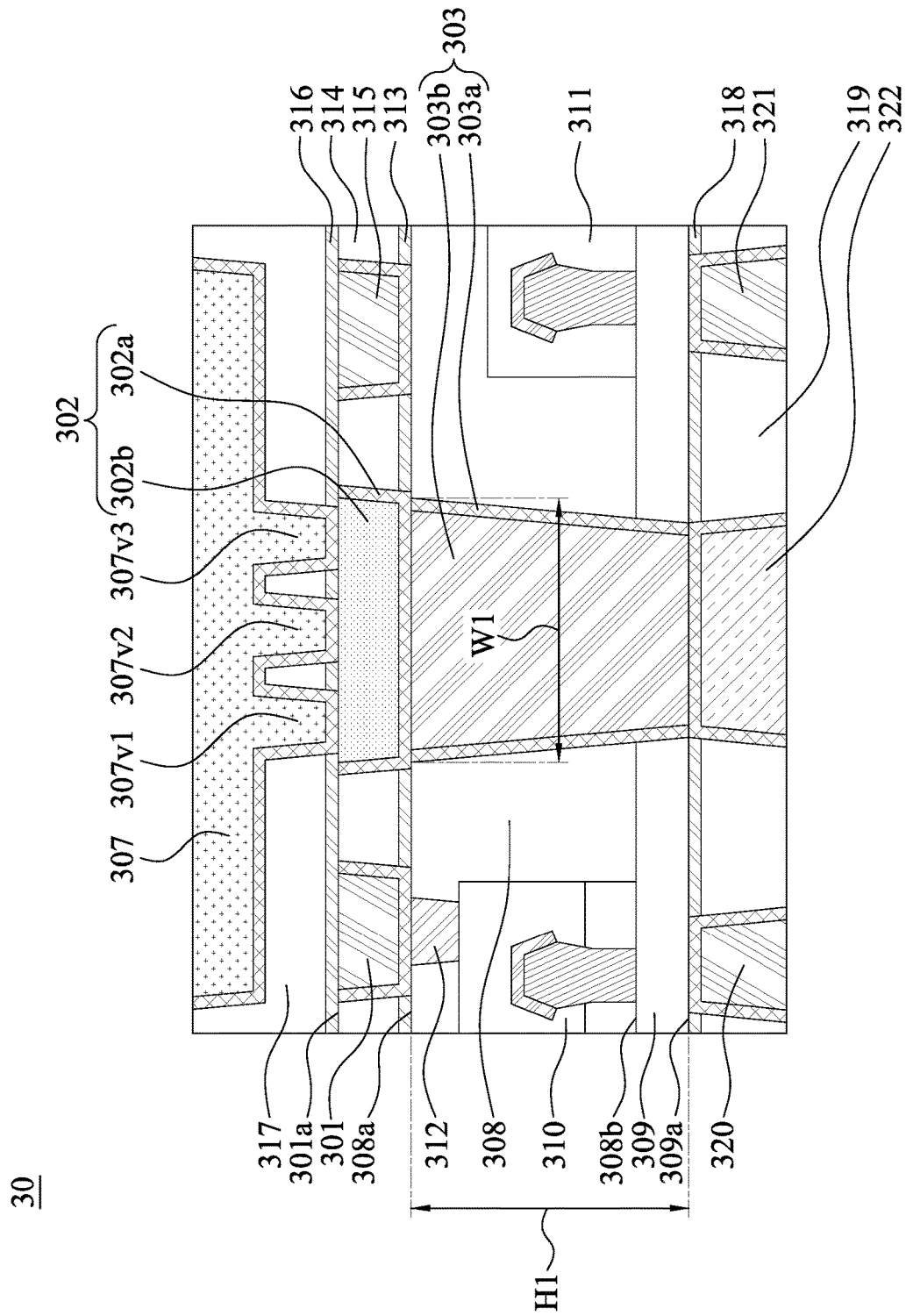
FIG. 3B illustrates an exemplary cross-section of a semiconductor structure, in accordance with some embodiments of the present disclosure.

FIG. 3B illustrates an exemplary cross-section of a semiconductor structure 30, in accordance with some embodiments of the present disclosure. The cross-section shown in FIG. 3B can correspond to the cross-section obtained along the dashed line C-C' of FIG. 3A. A substrate 308 is provided. The substrate 308 has a surface 308a and a surface 308b opposite the surface 308a. An isolation layer 309 is formed under the surface 308b. The isolation layer 309 contacts the surface 308b of the substrate 308. The isolation layer 309 has a surface 309a facing away from the substrate 308. The semiconductor structure 30 includes electronic devices 310 and 311 embedded in the substrate 308. The electronic devices 310 and 311 may be of different conductive types.

An interconnection structure 303 extends from the surface 308a of the substrate 308 to the surface 309a of the isolation layer 309. The interconnection structure 303 has a first end exposed by the surface 308a of the substrate 308 and a second end exposed by the surface 309a of the isolation layer 309. The interconnection structure 303 penetrates the substrate 308 and the isolation layer 309. The interconnection structure 303 can be configured to transmit signals. The electronic device 310 may receive power from the conductive structure 301. The electronic device 310 may receive signal from the interconnection structure 303.

An isolation layer 313 is disposed on the surface 308a of the substrate 308. An isolation layer 314 is disposed on the isolation layer 313. A conductive structure 301 is disposed on the surface 308a of the substrate 308. The conductive structure 301 is embedded in the isolation layer 314. The conductive structure 301 has a surface 301a facing away from the substrate 308. A conductive structure 315 is disposed on the surface 308a of the substrate 308. The conductive structure 315 is embedded in the isolation layer 314. A conductive structure 302 is disposed on the surface 308a of the substrate 308. The conductive structure 302 is embedded in the isolation layer 314.

An isolation layer 316 is disposed on the surface 301a of the conductive structure 301. The isolation layer 316 is disposed on the isolation layer 314. An isolation layer 317 is disposed on the isolation layer 316. A conductive structure 307 is disposed on the surface 308a of the substrate 308. The conductive structure 307 comprises vias 307v1-307v3. The vias 307v1-307v3 are disposed on the surface 301a of the conductive structure 301. The via 307v1 contacts the conductive structure 302. The via 307v2 contacts the conductive structure 302. The via 307v3 contacts the conductive structure 302. An interconnection structure 312 electrically connects the conductive structure 301 and the electronic device 310.

An isolation layer 318 is disposed under the surface 309a of the isolation layer 309. An isolation layer 319 is disposed under the isolation layer 318. A conductive structure 320 is disposed under the surface 309a of the isolation layer 309. The conductive structure 320 is embedded in the isolation layer 319. The conductive structure 320 contacts the surface 309a of the isolation layer 309. A conductive structure 321 is disposed under the surface 309a of the isolation layer 309. The conductive structure 321 is embedded in the isolation layer 319. The conductive structure 321 contacts the surface 309a of the isolation layer 309. A conductive structure 322 is disposed under the surface 309a of the isolation layer 309. The conductive structure 322 is embedded in the isolation layer 319. The conductive structure 322 contacts the surface 309a of the isolation layer 309. The conductive structure 322 contacts the interconnection structure 303. The conductive structure 302 and the conductive structure 322 are electrically connected by the interconnection structure 303.

As shown in FIG. 3B, the electronic device 310 and the electronic device 311 are disposed on different sides of the interconnection structure 303. The conductive structure 301 and the conductive structure 320 are configured to receive a first reference voltage (e.g., VDD). The conductive structure 315 and the conductive structure 321 are configured to receive a second reference voltage (e.g., VSS). The conductive structure 315 is spaced apart from the conductive structure 301. The conductive structure 321 is spaced apart from the conductive structure 320. The conductive structure 302 is spaced apart from the conductive structures 301 and 315. The conductive structure 322 is spaced apart from the conductive structure 320 and 321.

The conductive structures 302 and 322 are configured to receive a signal. In some embodiments, the interconnection structure 303 is used for transmitting signals, such as, for example, control signals for the electronic device 310 and/or the electronic device 311. In some embodiments, the transmission in the interconnection structure 303 can be periodic or aperiodic signals. The electronic device 310 may receive power from the conductive structure 301. The electronic device 310 may receive signals from the interconnection structure 303.

The interconnection structure 303 comprises a body 303b and a barrier layer 303a. The barrier layer 303a is disposed on sidewalls and a bottom surface of the body 303b. The barrier layer 303a of the interconnection structure 303 comprises one or more of Ta, TaN, Co, Ru, Al, Ti, TiN, Mn, Nb or air. The body 303b of the interconnection structure 303 comprises one or more of Cu, Ru, W, Ti, Al, Co, Mo, Ir, Rh.

The conductive structure 302 comprises a body 302b and a barrier layer 302a. The barrier layer 302a is disposed on sidewalls and a bottom surface of the body 302b. The barrier layer 302a of the conductive structure 302 comprises one or more of Ta, TaN, Co, Ru, Al, Ti, TiN, Mn, Nb or air. The body 302b of the conductive structure 302 comprises one or more of Cu, Ru, W, Ti, Al, Co, Mo, Ir, Rh.

As shown in FIG. 3B, a distance H1 from the surface 308a of the substrate 308 to the surface 309a of the isolation layer 309 is in a range of about 100 to about 1000 nm. A distance W1 between one sidewall on one side of the interconnection structure 303 and the other sidewall on the other side of the interconnection structure 303 is in a range of about 20 to about 200 nm.

Figure 4:
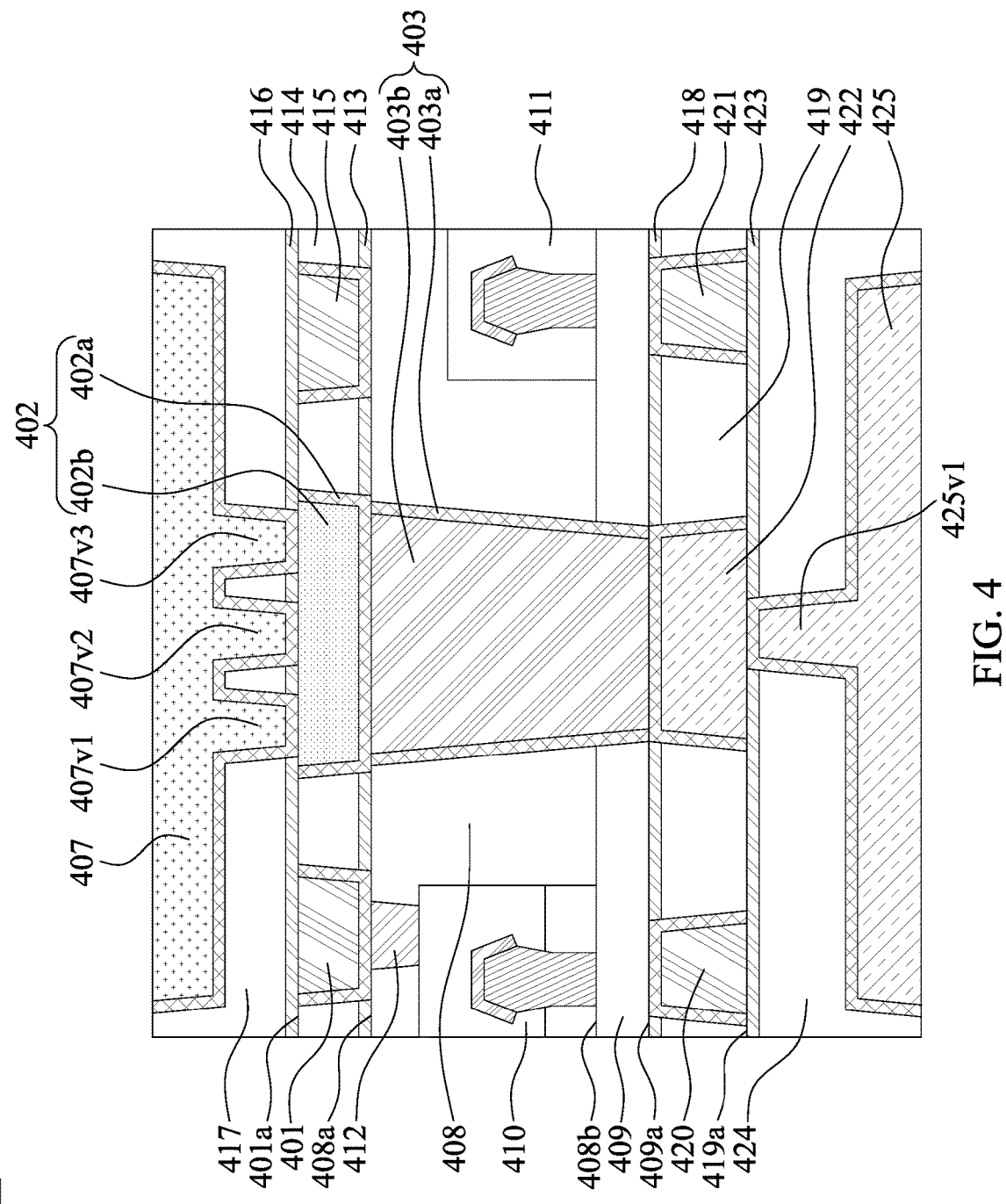
FIG. 4 illustrates an exemplary cross-section of a semiconductor structure, in accordance with some embodiments of the present disclosure.

FIG. 4 illustrates an exemplary cross-section of a semiconductor structure 40, in accordance with some embodiments of the present disclosure. The cross-section shown in FIG. 4 can correspond to the cross-section obtained along the dashed line C-C' of FIG. 3A. A substrate 408 is provided. The substrate 408 has a surface 408a and a surface 408b opposite the surface 408a. An isolation layer 409 is formed under the surface 408b. The isolation layer 409 contacts the surface 408b of the substrate 408. The isolation layer 409 has a surface 409a facing away from the substrate 408. The semiconductor structure 40 includes electronic devices 410 and 411 embedded in the substrate 408. The electronic devices 410 and 411 may be of different conductive types. An interconnection structure 403 extends from the surface 408a of the substrate 408 to the surface 409a of the isolation layer 409. One terminal of the interconnection structure 403 can be exposed by the surface 408a of the substrate 408, and the other terminal of the interconnection structure 403 can be exposed by the surface 409a of the isolation layer 409. The interconnection structure 403 can be configured to transmit signals. The electronic device 410 may receive power from the conductive structure 401. The electronic device 410 may receive signals from the interconnection structure 403.

An isolation layer 413 is disposed on the surface 408a of the substrate 408. An isolation layer 414 is disposed on the isolation layer 413. A conductive structure 401 is disposed on the surface 408a of the substrate 408. The conductive structure 401 is embedded in the isolation layer 414. The conductive structure 401 has a surface 401a facing away from the substrate 408. A conductive structure 415 is disposed on the surface 408a of the substrate 408. The conductive structure 415 is embedded in the isolation layer 414. A conductive structure 402 is disposed on the surface 408a of the substrate 408. The conductive structure 402 is embedded in the isolation layer 414.

An isolation layer 416 is disposed on the surface 401a of the conductive structure 401. The isolation layer 416 is disposed on the isolation layer 414. An isolation layer 417 is disposed on the isolation layer 416. A conductive structure 407 is disposed on the surface 408a of the substrate 408. The conductive structure 407 comprises vias 407v1-407v3. The vias 407v1-407v3 are disposed on the surface 401a of the conductive structure 401. The via 407v1 contacts the conductive structure 402. The via 407v2 contacts the conductive structure 402. The via 407v3 contacts the conductive structure 402. An interconnection structure 412 electrically connects the conductive structure 401 and the electronic device 410. The vias 407v1-407v3 of the conductive structure 407 covers a first portion of the conductive structure 402 and exposes a second portion of the conductive structure 402.

An isolation layer 418 is disposed under the surface 409a of the isolation layer 409. An isolation layer 419 is disposed under the isolation layer 418. A conductive structure 420 is disposed under the surface 409a of the isolation layer 409. The conductive structure 420 is embedded in the isolation layer 419. The conductive structure 420 contacts the surface 409a of the isolation layer 409. A conductive structure 421 is disposed under the surface 409a of the isolation layer 409. The conductive structure 421 is embedded in the isolation layer 419. The conductive structure 421 contacts the surface 409a of the isolation layer 409. A conductive structure 422 is disposed under the surface 409a of the isolation layer 409. The conductive structure 422 is embedded in the isolation layer 419. The conductive structure 422 contacts the surface 409a of the isolation layer 409. The conductive structure 422 contacts the interconnection structure 403. The conductive structure 402 and the conductive structure 422 are electrically connected by the interconnection structure 403.

An isolation layer 423 is disposed under a surface 419a of the isolation layer 419. An isolation layer 424 is disposed under the isolation layer 423. A conductive structure 425 is disposed under the surface 419a of the isolation layer 419. The conductive structure 425 is embedded in the isolation layer 424. The conductive structure 425 contacts the surface 419a of the isolation layer 419. The conductive structure 425 contacts the conductive structure 422. The conductive structure 425 comprises a via 425v1. The via 425v1 is disposed under the surface 419a of the isolation layer 419. The via 425v1 contacts the conductive structure 422. The conductive structure 407 and the conductive structure 425 are electrically connected by the conductive structure 402, the interconnection structure 403 and conductive structure 422.

As shown in FIG. 4, the electronic device 410 and the electronic device 411 are disposed on different sides of the interconnection structure 403. The conductive structure 401 and the conductive structure 420 are configured to receive a first reference voltage (e.g., VDD). The conductive structure 415 and the conductive structure 421 are configured to receive a second reference voltage (e.g., VSS). The conductive structure 415 is spaced apart from the conductive structure 401. The conductive structure 421 is spaced apart from the conductive structure 420. The conductive structure 402 is spaced apart from the conductive structures 401 and 415. The conductive structure 422 is spaced apart from the conductive structure 420 and 421. The conductive structure 402, 422 and 425 are configured to receive a signal. In some embodiments, the interconnection structure 403 is used for transmitting signals. The electronic device 410 receive power from the conductive structure 401. The electronic device 410 may receive signals from the interconnection structure 403.

The interconnection structure 403 comprises a body 403b and a barrier layer 403a. The barrier layer 403a is disposed on sidewalls and a bottom surface of the body 403b. The barrier layer 403a of the interconnection structure 403 comprises one or more of Ta, TaN, Co, Ru, Al, Ti, TiN, Mn, Nb or air. The body 403b of the interconnection structure 403 comprises one or more of Cu, Ru, W, Ti, Al, Co, Mo, Ir, Rh.

The conductive structure 402 comprises a body 402b and a barrier layer 402a. The barrier layer 402a is disposed on sidewalls and a bottom surface of the body 402b. The barrier layer 402a of the conductive structure 402 comprises one or more of Ta, TaN, Co, Ru, Al, Ti, TiN, Mn, Nb or air. The body 402b of the conductive structure 402 comprises one or more of Cu, Ru, W, Ti, Al, Co, Mo, Ir, Rh.

Figure 5A:
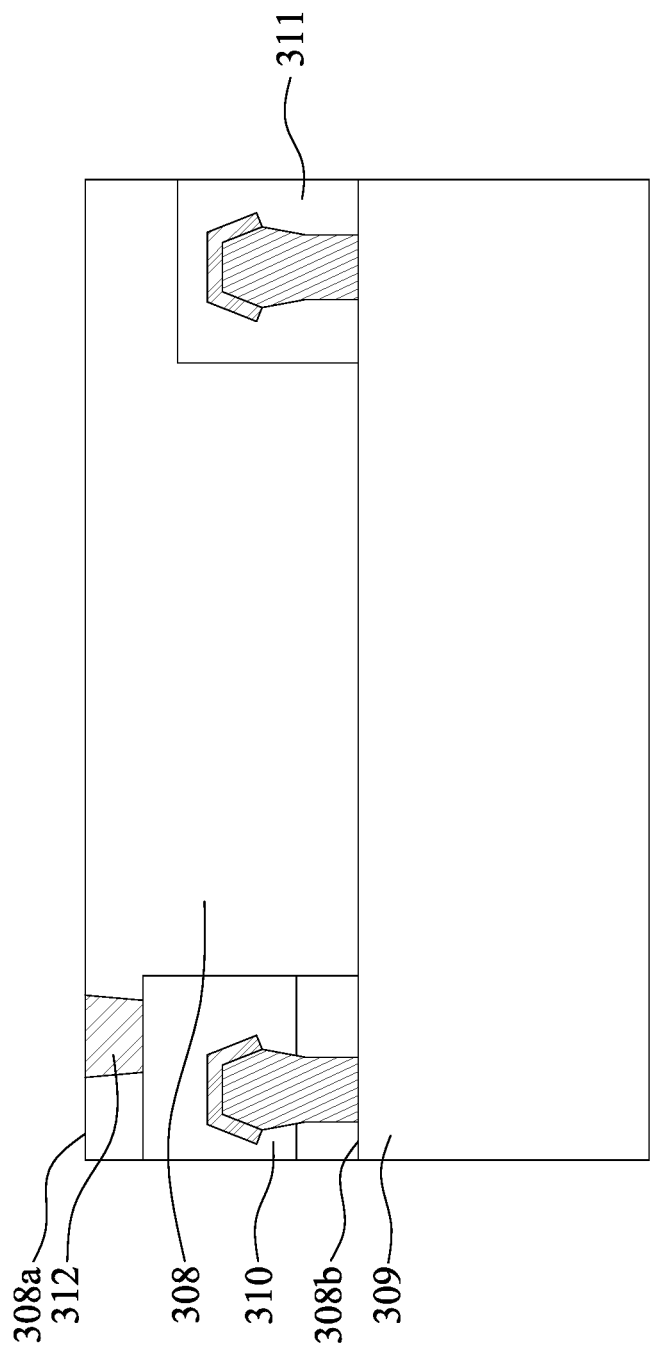
FIG. 5A, FIG. 5B, FIG. 5C, FIG. 5D, and FIG. 5E illustrate various stages of manufacturing a semiconductor device structure, in accordance with some embodiments of the present disclosure.

FIG. 5A, FIG. 5B, FIG. 5C, FIG. 5D, and FIG. 5E illustrate various stages of manufacturing a semiconductor device structure 30, in accordance with some embodiments of the present disclosure. As shown in FIG. 5A, a substrate 308 is provided. The substrate 308 has a surface 308a and a surface 308b opposite the surface 308a. An isolation layer 309 is formed under the surface 308b. The isolation layer 309 contacts the surface 308b of the substrate 308. The substrate 308 includes electronic devices 310 and 311 embedded in the substrate 308. The electronic devices 310 and 311 may be of different conductive types. The substrate 308 includes an interconnection structure 312 embedded in the substrate 308.

Figure 5B:
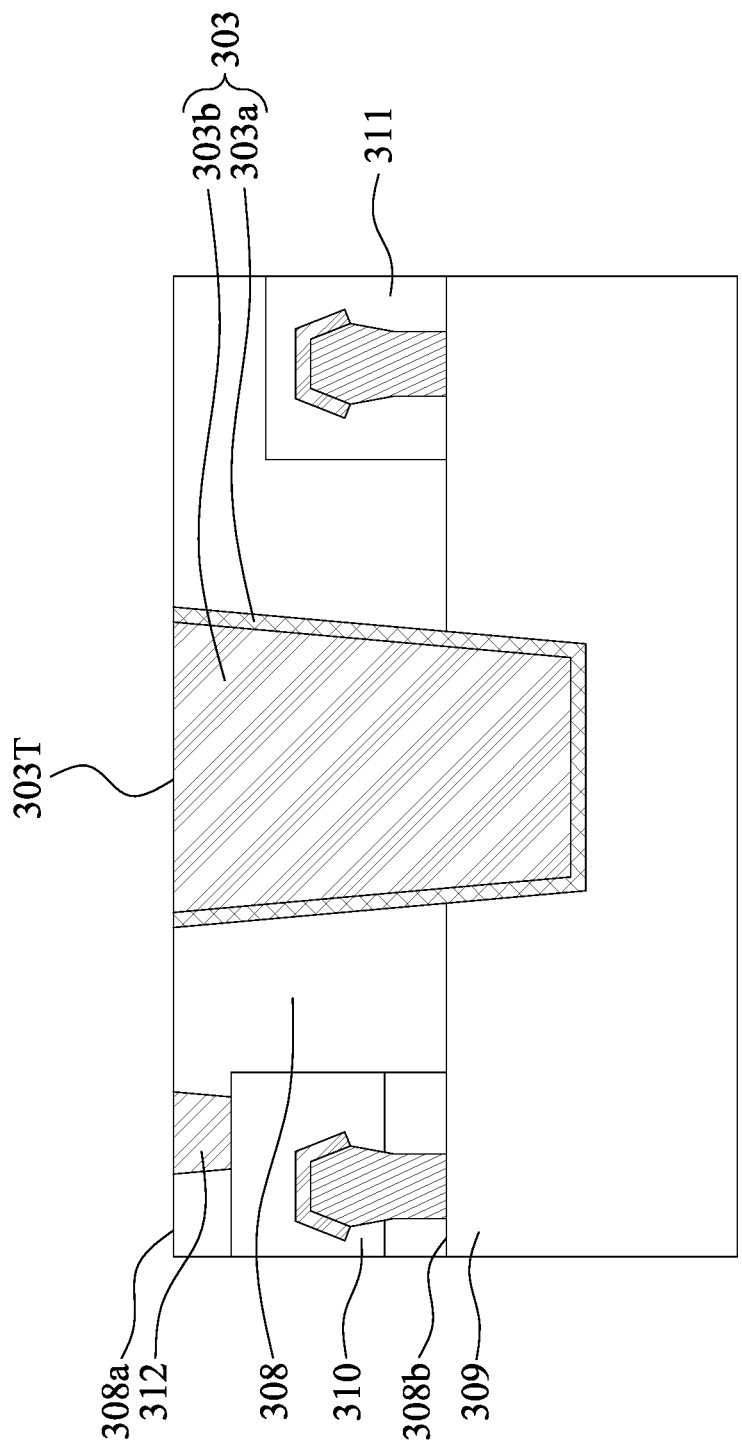

Referring to FIG. 5B, a trench 303T is formed in the substrate 308 and the isolation layer 309 by removing a portion of the substrate 308 and a portion of the isolation layer 309. A barrier layer 303a is formed on sidewalls and a bottom surface of the trench 303T. A material is filled in the trench 303T to form a body 303b. The top surfaces of the barrier layer 303a and the body 303b are flush with the surface 308a of the substrate 308. The barrier layer 303a and the body 303b form an interconnection structure 303 in the substrate 308 and the isolation layer 309. The interconnection structure 303 extends from the surface 308a of the substrate 308 into the isolation layer 309. One terminal of the interconnection structure 303 can be exposed by the surface 308a of the substrate 308.

Figure 5C:
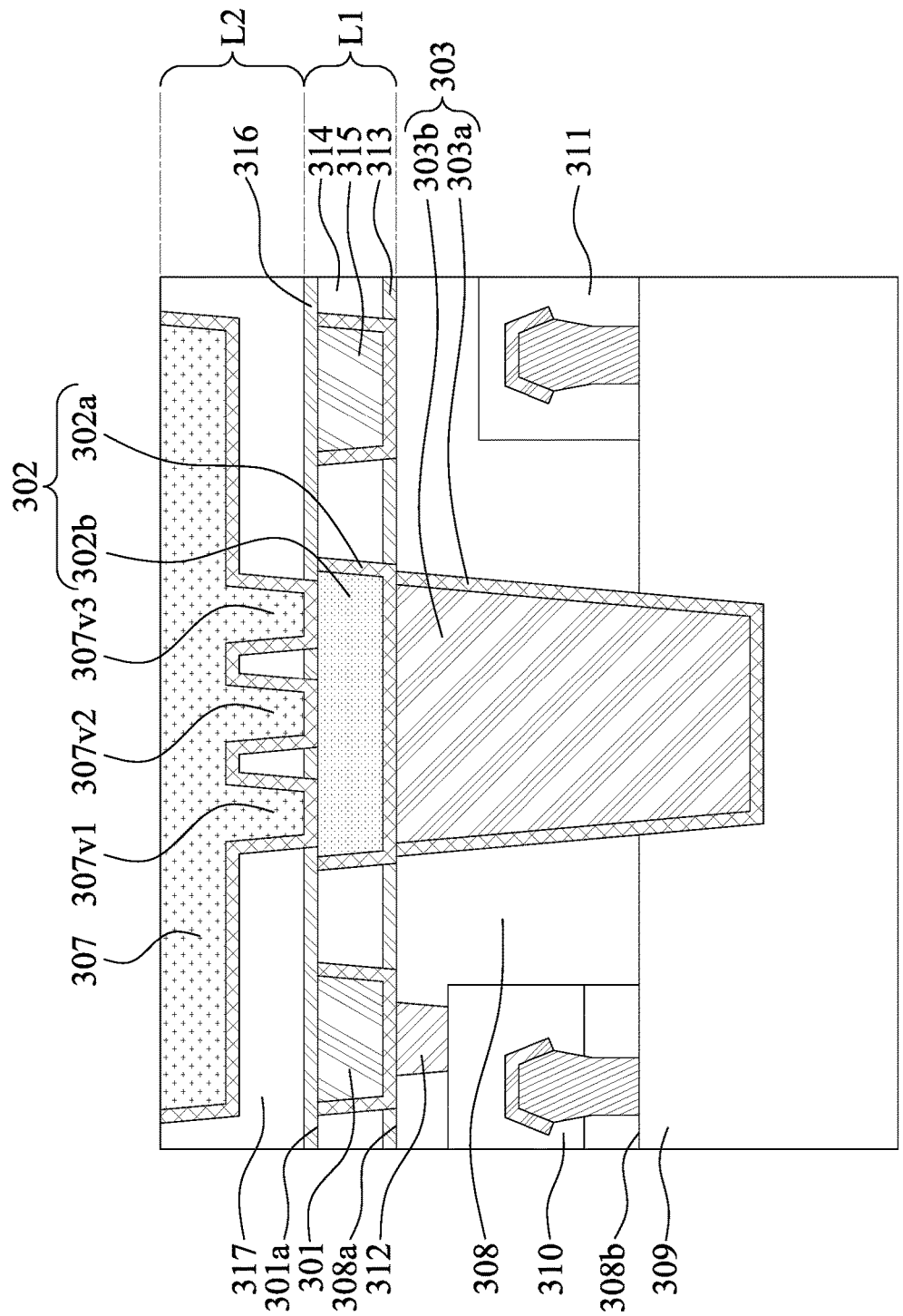

Referring to FIG. 5C, an isolation layer 313 is formed on the surface 308a of the substrate 308. An isolation layer 314 is formed on the isolation layer 313. Conductive structures 301, 302, and 315 are embedded in the isolation layer 314. The isolation layers 313 and 314 and the conductive structure 301, 302, and 315 form a level L1 of conductive structures on the surface 308a of the substrate 308. An isolation layer 316 is formed on a surface 301a of the conductive structure 301. The isolation layer 316 is formed on the isolation layer 314. An isolation layer 317 is formed on the isolation layer 316. A conductive structure 307 is embedded in the isolation layer 317. The conductive structure 307 comprises vias 307v1-307v3. The vias 307v1-307v3 are formed on the surface 301a of the conductive structure 301. The vias 307v1-307v3 are in contact with the conductive structure 302. The vias 307v1-307v3 of the conductive structure 307 covers a first portion of the conductive structure 302 and exposes a second portion of the conductive structure 302. The isolation layers 316 and 317 and the conductive structure 307 form a level L2 of conductive structures on the surface 308a of the substrate 308. The interconnection structure 312 electrically connects the conductive structure 301 and the electronic device 310.

Figure 5D:
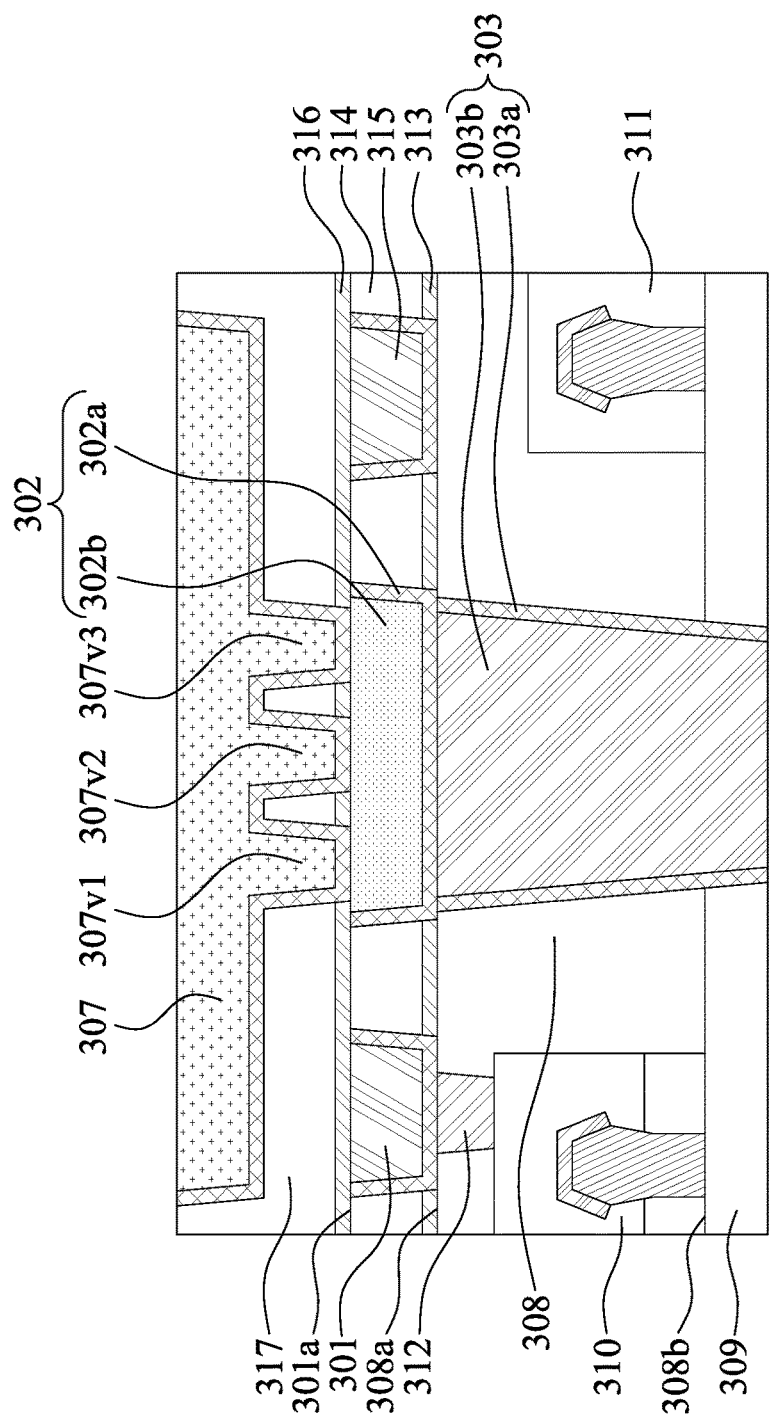

Referring to FIG. 5D, a portion of the isolation layer 309 on the lower side of the structure shown in FIG. 5C is removed. Also, a portion of the interconnection structure 303 is removed.

Figure 5E:
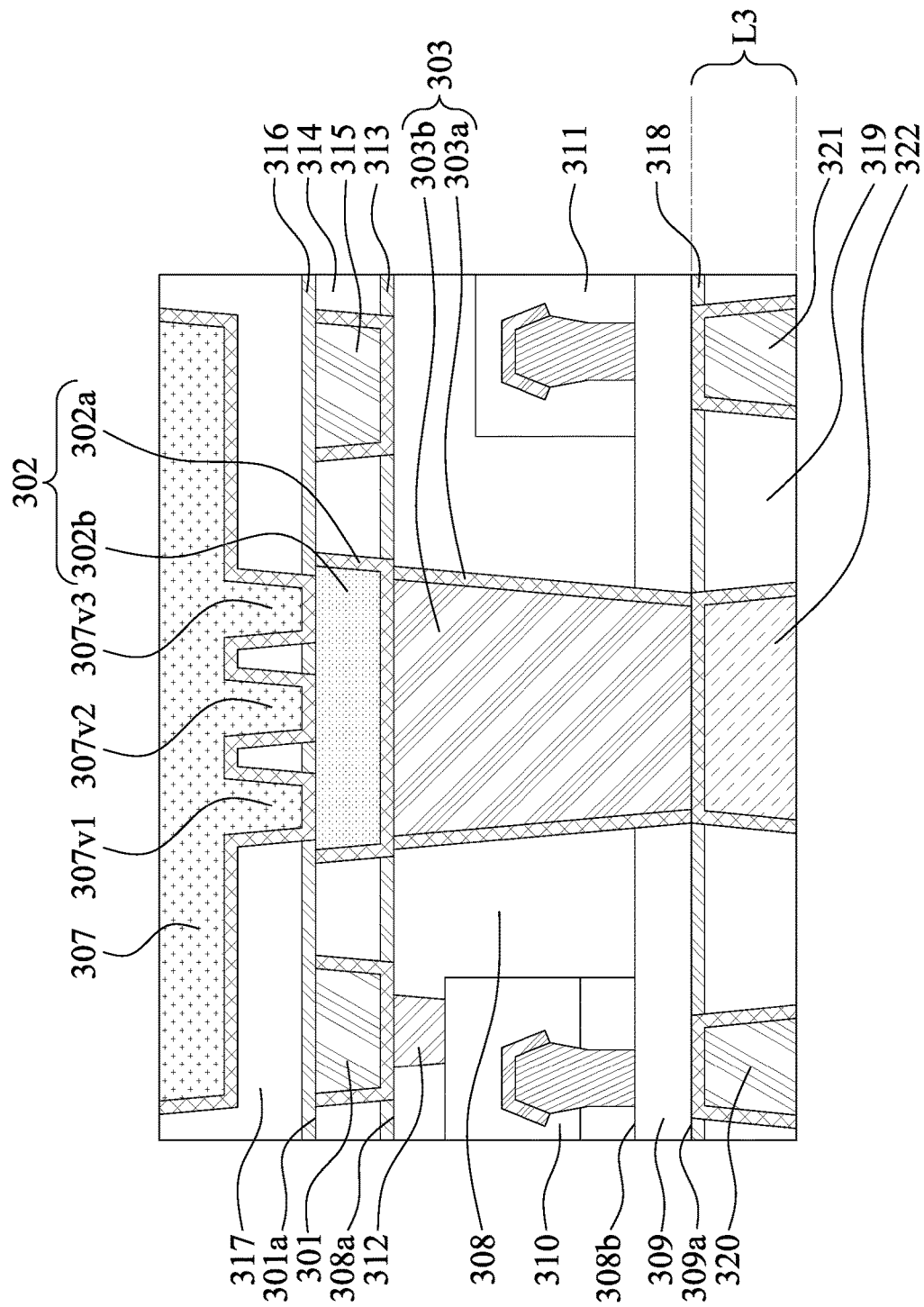

Referring to FIG. 5E, an isolation layer 318 is formed under the surface 309a of the isolation layer 309. An isolation layer 319 is formed under the isolation layer 318. Conductive structures 320, 321, and 322 are formed under the surface 309a of the isolation layer 309. The conductive structures 320, 321, and 322 are embedded in the isolation layer 319. The conductive structures 320, 321, and 322 are in contact with the surface 309a of the isolation layer 309. The conductive structure 322 contacts the interconnection structure 303. The isolation layers 318 and 319 and the conductive structures 320, 321, and 322 form a level L3 of conductive structures under the surface 309a of the isolation layer 309.

In the processes of FIGS. 5A-5E, first, the electronic devices 310 and 311 are formed in the substrate 308. Then the interconnection structure 303 is formed. Afterwards, the conductive structures 301, 302, 315, and 307 are formed above the interconnection structure 303. Finally, the conductive structures 320, 321, and 322 are formed under the interconnection structure 303. The interconnection structure 303 is formed before the formation of the conductive structures 301, 302, 315, and 307. The conductive structures 320, 321, and 322 are formed after the conductive structures 301, 302, 315, and 307.

FIG. 6A, FIG. 6B, FIG. 6C, and FIG. 6D illustrate various stages of manufacturing a semiconductor device structure 30, in accordance with some embodiments of the present disclosure. The stages shown in FIGS. 6A-6D indicates a different process for manufacturing a semiconductor device structure 30.

Figure 6A:
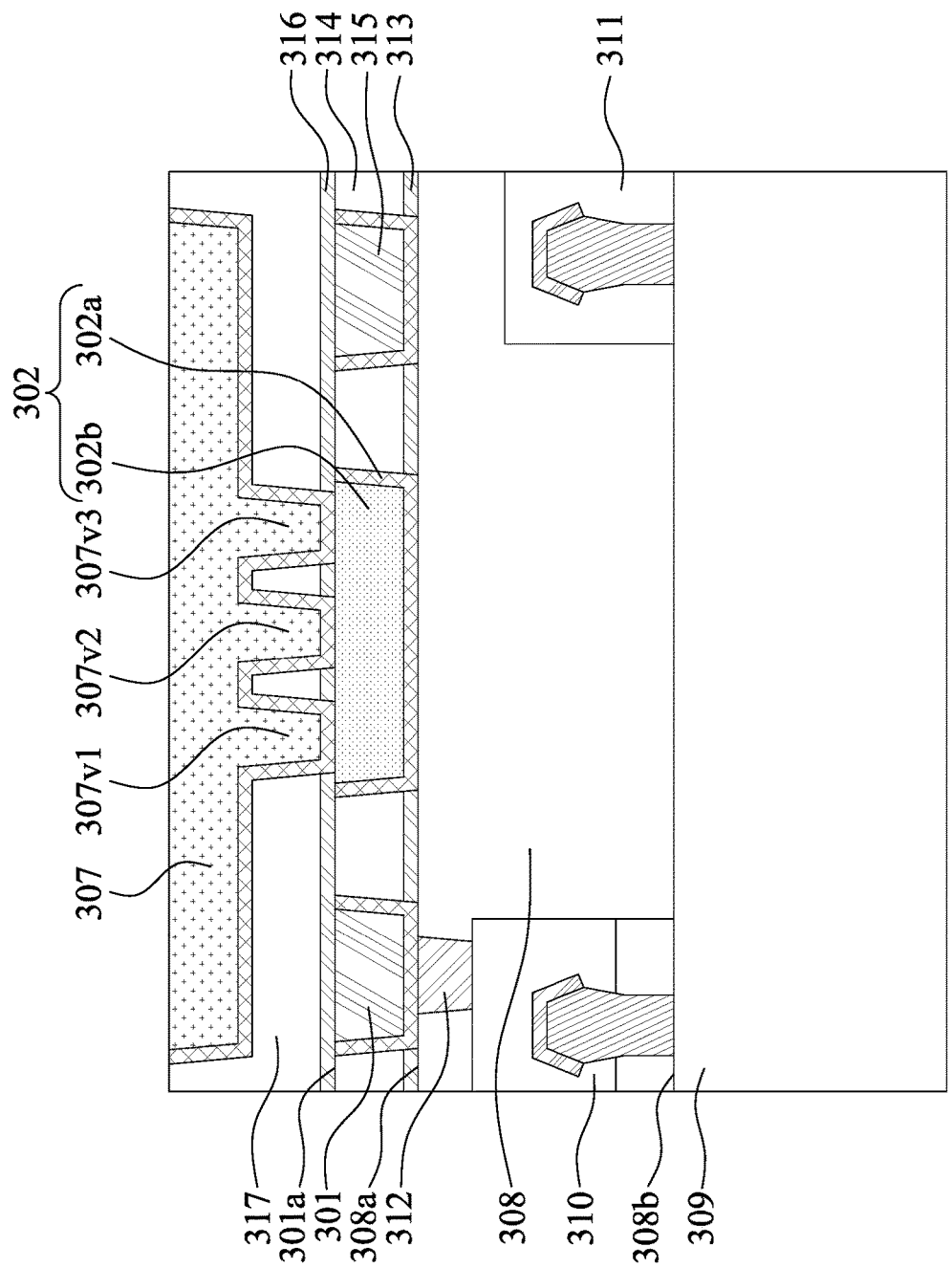
FIG. 6A, FIG. 6B, FIG. 6C, and FIG. 6D illustrate various stages of manufacturing a semiconductor device structure, in accordance with some embodiments of the present disclosure.

As shown in FIG. 6A, a substrate 308 is provided. The substrate 308 has a surface 308a and a surface 308b opposite the surface 308a. An isolation layer 309 is formed under the surface 308b. The isolation layer 309 contacts the surface 308b of the substrate 308. The substrate 308 includes electronic devices 310 and 311 embedded in the substrate 308. The electronic devices 310 and 311 may be of different conductive types. The substrate 308 includes an interconnection structure 312 embedded therein.

An isolation layer 313 is formed on the surface 308a of the substrate 308. An isolation layer 314 is formed on the isolation layer 313. Conductive structures 301, 302 and 315 are embedded in the isolation layer 314. An isolation layer 316 is formed on the surface 301a of the conductive structure 301. The isolation layer 316 is formed on the isolation layer 314. An isolation layer 317 is formed on the isolation layer 316. A conductive structure 307 is embedded in the isolation layer 317. The conductive structure 307 comprises vias 307v1-307v3. The vias 307v1-307v3 are formed on the surface 301a of the conductive structure 301. The vias 307v1-307v3 are in contact with the conductive structure 302. The vias 307v1-307v3 of the conductive structure 307 covers a first portion of the conductive structure 302 and exposes a second portion of the conductive structure 302. The interconnection structure 312 electrically connects the conductive structure 301 and the electronic device 310.

Figure 6B:
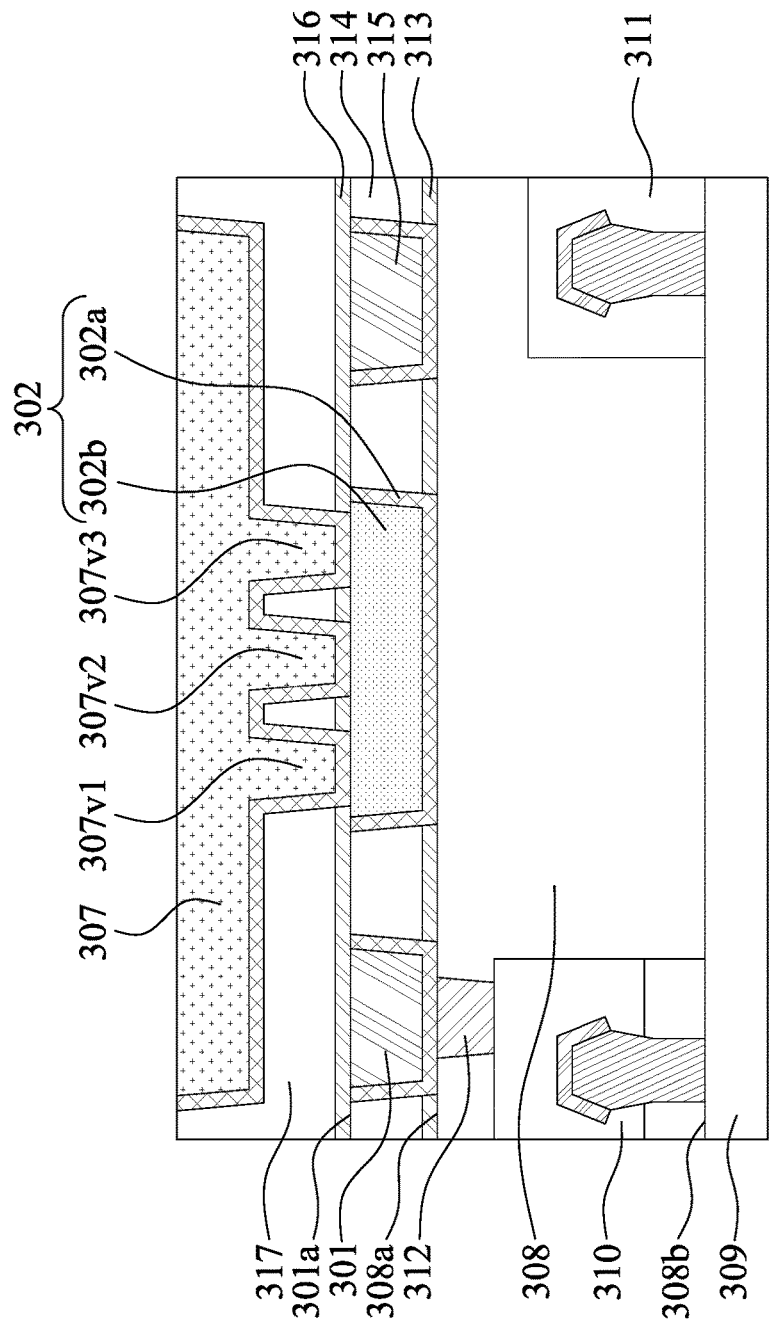

Referring to FIG. 6B, a portion of the isolation layer 309 on the lower side of the structure shown in FIG. 6A is removed.

Figure 6C:
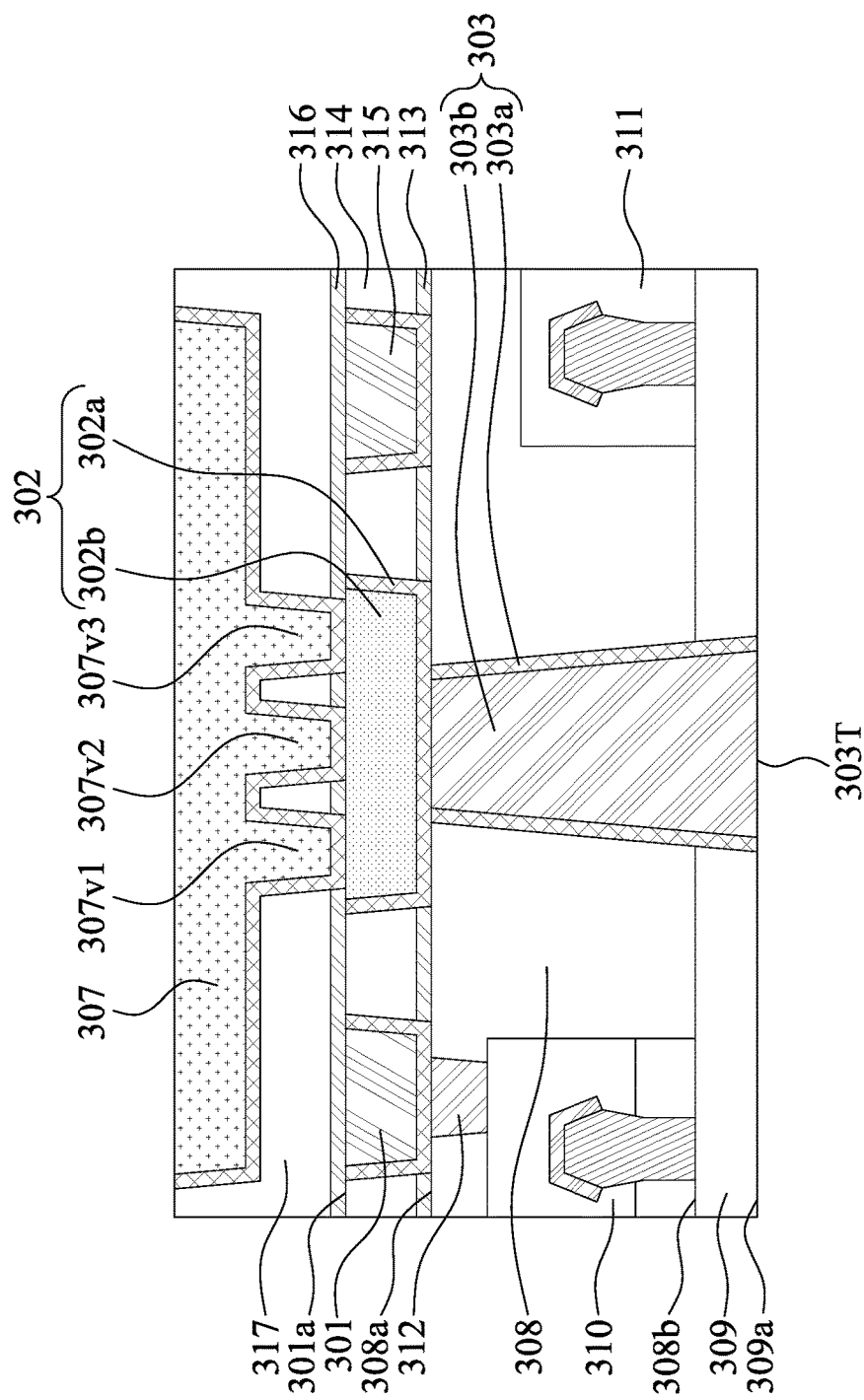

Referring to FIG. 6C, a trench 303T is formed in the substrate 308 and the isolation layer 309. A barrier layer 303a is formed on sidewalls and a bottom surface of the trench 303T. A material is filled in the trench 303T to form a body 303b. The bottom surfaces of the barrier layer 303a and the body 303b are flush with the surface 309a of the isolation layer 309. The barrier layer 303a and the body 303b form an interconnection structure 303 in the substrate 308 and the isolation layer 309. The interconnection structure 303 extends from the surface 308a of the substrate 308 to the surface 309a of the isolation layer 309. One terminal of the interconnection structure 303 can be exposed by the surface 309a of the isolation layer 309.

Figure 6D:
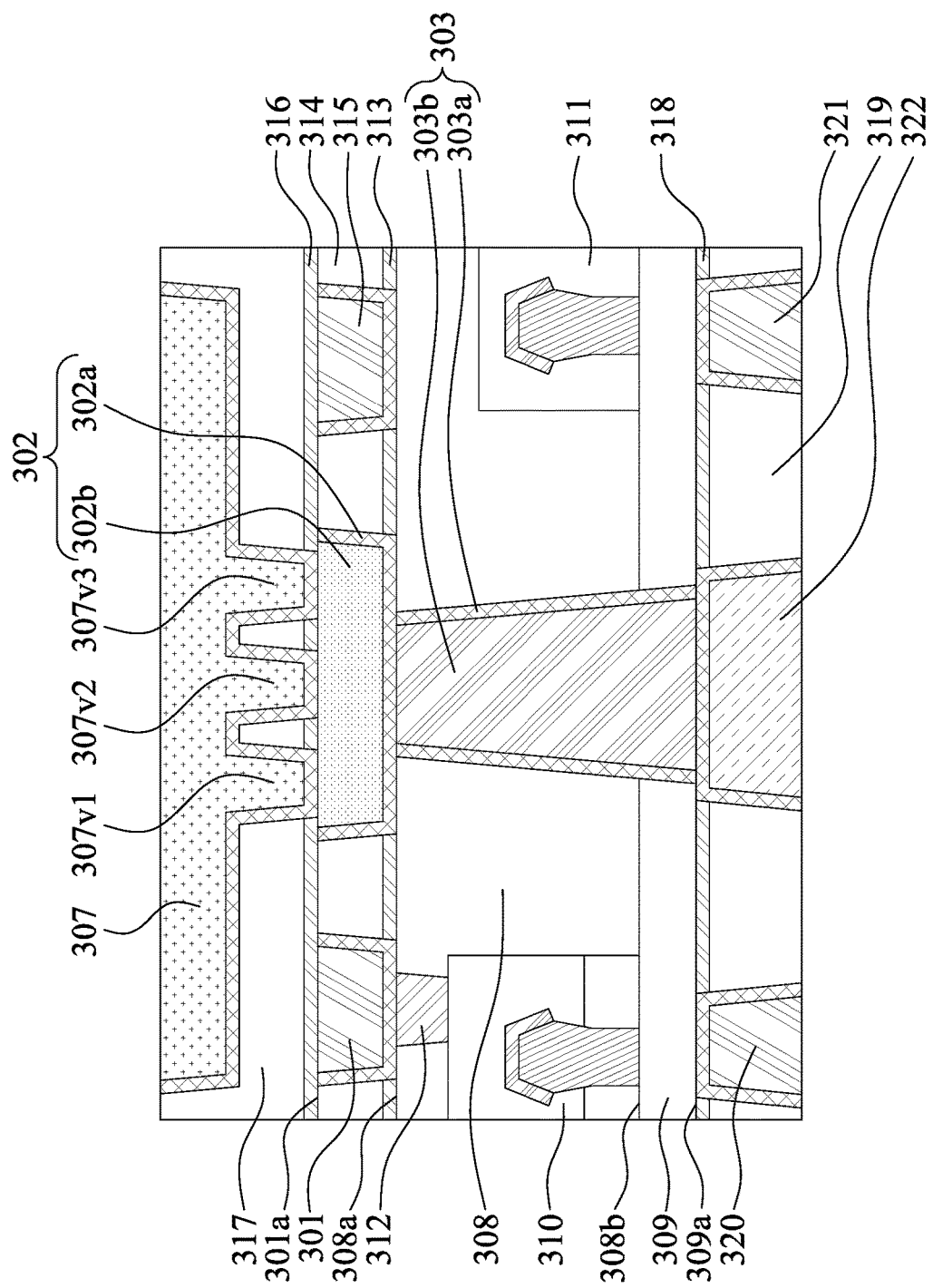

Referring to FIG. 6D, an isolation layer 318 is formed under the surface 309a of the isolation layer 309. An isolation layer 319 is formed under the isolation layer 318. Conductive structures 320, 321, and 322 are formed under the surface 309a of the isolation layer 309. The conductive structures 320, 321, and 322 are embedded in the isolation layer 319. The conductive structures 320, 321, and 322 are in contact with the surface 309a of the isolation layer 309. The conductive structure 322 contacts the interconnection structure 303.

In the processes of FIGS. 6A-6D, first, the electronic devices 310 and 311 are formed in the substrate 308, and the conductive structures 301, 302, 315, and 307 are formed above the substrate 308. Afterwards, the interconnection structure 303 is formed. Finally, the conductive structures 320, 321, and 322 are formed under the interconnection structure 303. The interconnection structure 303 is formed after the formation of the conductive structures 301, 302, 315, and 307. The conductive structures 320, 321, and 322 are formed after the interconnection structure 303.

Figure 7:
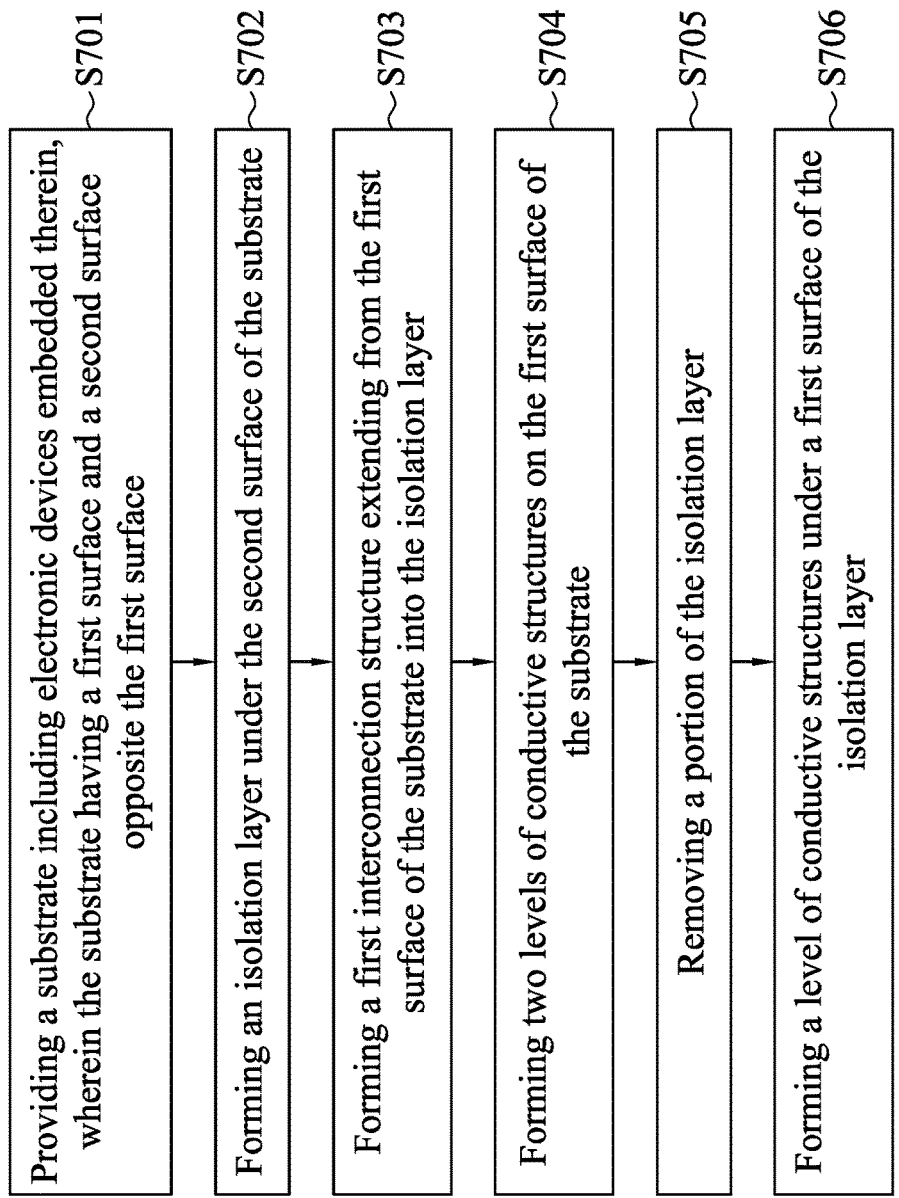
FIG. 7 is a flowchart illustrating a method for manufacturing a semiconductor device, in accordance with various aspects of the present disclosure.

FIG. 7 is a flowchart illustrating a method for manufacturing a semiconductor device, in accordance with various aspects of the present disclosure.

The method 700 includes operation S701. In operation S701, a substrate including electronic devices embedded therein is provided. The substrate has a first surface and a second surface opposite the first surface. For example, the substrate 308 as shown in FIG. 5A, is provided.

The method 700 includes operation S702. In operation S702, an isolation layer is formed under the second surface of the substrate. For example, an isolation layer 309 is formed under the surface 308b of the substrate 308, as shown in FIG. 5A.

The method 700 includes operation S703. In operation S703, a first interconnection structure is formed to extend from the first surface of the substrate into the isolation layer. For example, an interconnection structure 303 can be formed to extend from the surface 308a of the substrate 308 into the isolation layer 309, as shown in FIG. 5B.

The method 700 includes operation S704. In operation S704, two levels of conductive structures are formed on the first surface of the substrate. For example, two levels L1 and L2 of conductive structures can be formed on the surface 308a of the substrate 308, as shown in FIG. 5C.

The method 700 includes operation S705. In operation S705, a portion of the isolation layer is removed. For example, a portion of the isolation layer 309 can be removed, as shown in FIG. 5D.

The method 700 includes operation S706. In operation S706, a level of conductive structures is formed under a first surface of the isolation layer. For example, a level L3 of conductive structures can be formed under a surface 309a of the isolation layer 309, as shown in FIG. 5E.

In some embodiments, formation of the two levels of conductive structures comprises forming a second level of conductive structures on a first surface of a first level of conductive structures. For example, the formation of the two levels of conductive structures comprises forming a second level L2 of conductive structures on a first surface 301a of a first level L1 of conductive structures, as shown in FIG. 5C. In some embodiments, formation of an interconnection structure comprises forming a barrier layer on sidewalls and a bottom surface of a via and filling a material in the via. For example, forming an interconnection structure 303 can comprise forming a barrier layer 303a on sidewalls and a bottom surface of a trench 303T and filling a material in the trench 303T to form a body 303b, as shown in FIG. 5B.

The method 700 is merely an example, and is not intended to limit the present disclosure beyond what is explicitly recited in the claims. Additional operations can be provided before, during, or after each operation of the method 700, and some operations described can be replaced, eliminated, or reordered for additional embodiments of the method. In some embodiments, the method 700 can include further operations not depicted in FIG. 7.

Some embodiments of the present disclosure provide a semiconductor device. The semiconductor device comprises a substrate, an isolation layer, a first electronic device, a first interconnection structure, a first conductive structure, and a second conductive structure. The substrate has a first surface and a second surface opposite the first surface. The isolation layer contacts the second surface of the substrate and has a first surface facing away from the substrate. The first electronic device is embedded in the substrate. The first interconnection structure extends from the first surface of the substrate to the first surface of the isolation layer. The first conductive structure is disposed on the first surface of the substrate. The second conductive structure is disposed in contact with the first surface of the isolation layer. The first conductive structure and the second conductive structure are electrically connected by the first interconnection structure.

Some embodiments of the present disclosure provide a semiconductor device. The semiconductor device comprises a substrate, an isolation layer, a first interconnection structure, a first conductive structure, and a second conductive structure. The substrate has a first surface and a second surface opposite the first surface. The isolation layer is disposed under the second surface of the substrate and having a first surface. The first interconnection structure has a first end exposed by the first surface of the substrate and a second end exposed by the first surface of the isolation layer. The first conductive structure is disposed on the first surface of the substrate. The second conductive structure is disposed under the first surface of the isolation layer. The first conductive structure and the second conductive structure are electrically connected by the first interconnection structure and configured to receive a first signal.

Some embodiments of the present disclosure provide a method of manufacturing a semiconductor device. The method comprises providing a substrate including electronic devices embedded therein, forming an isolation layer under the second surface of the substrate, forming a first interconnection structure extending from the first surface of the substrate into the isolation layer, forming two levels of conductive structures on the first surface of the substrate, removing a portion of the isolation layer, and forming a level of conductive structures under a first surface of the isolation layer. The substrate has a first surface and a second surface opposite the first surface.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate having a first surface and a second surface opposite the first surface;

an isolation layer in contact with the second surface of the substrate and having a first surface facing away from the substrate, wherein the isolation layer is absent above the second surface of the substrate;
a first electronic device embedded in the substrate;
a first interconnection structure extended from the first surface of the substrate to the first surface of the isolation layer, wherein a width of the first interconnection structure contacting the first surface of the substrate is larger than that contacting the second surface of the substrate;
a first conductive structure disposed on the first surface of the substrate; and
a second conductive structure disposed in contact with the first surface of the isolation layer, wherein
the first conductive structure and the second conductive structure are electrically connected by the first interconnection structure.

2. The semiconductor device of claim 1, further comprising a second interconnection structure embedded in the substrate, wherein the second interconnection structure electrically connects a third conductive structure and the first electronic device.

3. The semiconductor device of claim 1, further comprising a second electronic device embedded in the substrate, wherein the first electronic device and the second electronic device are disposed on different sides of the first interconnection structure.

4. The semiconductor device of claim 2, wherein the third conductive structure and a fourth conductive structure are configured to receive a first reference voltage.

5. The semiconductor device of claim 1, further comprising:
a third conductive structure disposed on the first surface of the substrate, wherein the third conductive structure is spaced apart from the first conductive structure.

6. The semiconductor device of claim 5, further comprising:
a fourth conductive structure disposed under the first surface of the isolation layer, wherein the fourth conductive structure is spaced apart from the second conductive structure.

7. The semiconductor device of claim 1, wherein the first interconnection structure comprises a body and a barrier layer disposed on sidewalls of the body.

8. The semiconductor device of claim 6, further comprising:
a fifth conductive structure disposed above a first surface of the first conductive structure, wherein the fifth conductive structure contacts the first conductive structure.

9. The semiconductor device of claim 1, wherein the first conductive structure covers the first interconnection structure from the top view perspective.

10. The semiconductor device of claim 8, wherein the fifth conductive structure includes vias disposed at the intersection of the first conductive structure and the fifth conductive structure.

11. A semiconductor device, comprising:
a substrate having a first surface and a second surface opposite the first surface;
an isolation layer disposed under the second surface of the substrate and having a first surface, wherein the isolation layer is absent above the second surface of the substrate;
a first interconnection structure having a first end exposed by the first surface of the substrate and a second end exposed by the first surface of the isolation layer, wherein a width of the first interconnection structure contacting the first surface of the substrate is larger than that contacting the second surface of the substrate;
a first conductive structure disposed on the first surface of the substrate; and
a second conductive structure disposed under the first surface of the isolation layer, wherein
the first conductive structure and the second conductive structure are electrically connected by the first interconnection structure and configured to receive a first signal.

12. The semiconductor device of claim 11, wherein the first interconnection structure comprises a body and a barrier layer disposed on sidewalls of the body.

13. The semiconductor device of claim 12, wherein the barrier layer comprises one or more of the following materials: Ta, TaN, Co, Ru, Al, Ti, TiN, Mn, Nb or air.

14. The semiconductor device of claim 12, wherein the body comprises one or more of the following materials: Cu, Ru, W, Ti, Al, Co, Mo, Ir, Rh.

15. The semiconductor device of claim 11, wherein a distance from the first surface of the substrate to the first surface of the isolation layer is in a range of about 100 to about 1000 nm.

16. The semiconductor device of claim 11, wherein the first conductive structure comprises a body and a barrier layer disposed on sidewalls and a bottom surface of the body.

17. The semiconductor device of claim 11, further comprising:
a third conductive structure disposed on a first surface of the substrate; and
a fourth conductive structure disposed under a first surface of the isolation layer, wherein the third conductive structure and the fourth conductive structure are configured to receive a reference voltage.

18. A semiconductor device, comprising:
a substrate including electronic devices embedded therein, wherein the substrate having a first surface and a second surface opposite the first surface;
an isolation layer under the second surface of the substrate and having a first surface, wherein the isolation layer is absent above the second surface of the substrate;
a first interconnection structure extending from the first surface of the substrate into the isolation layer, wherein a width of the first interconnection structure contacting the first surface of the substrate is larger than that contacting the second surface of the substrate;
two levels of conductive structures on the first surface of the substrate; and
a level of conductive structures under a first surface of the isolation layer.

19. The semiconductor device of claim 18, wherein a second level of the two levels of conductive structures is formed on a first surface of a first level of conductive structures.

20. The semiconductor device of claim 18, wherein the first interconnection structure comprises a body and a barrier layer disposed on sidewalls of the body.

* * * * *